(12) United States Patent
Arai

(10) Patent No.: US 10,109,641 B2
(45) Date of Patent: Oct. 23, 2018

(54) SEMICONDUCTOR DEVICE AND METHOD FOR MANUFACTURING SAME

(71) Applicant: Toshiba Memory Corporation, Minato-ku (JP)

(72) Inventor: Shinya Arai, Yokkaichi (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 15/003,919

(22) Filed: Jan. 22, 2016

(65) Prior Publication Data

US 2017/0047341 A1    Feb. 16, 2017

Related U.S. Application Data

(60) Provisional application No. 62/203,046, filed on Aug. 10, 2015.

(51) Int. Cl.
| | |
|---|---|
| *H01L 27/115* | (2017.01) |
| *H01L 27/11582* | (2017.01) |
| *H01L 21/311* | (2006.01) |
| *H01L 21/02* | (2006.01) |
| *H01L 27/1157* | (2017.01) |
| *H01L 27/11575* | (2017.01) |

(52) U.S. Cl.
CPC .. *H01L 27/11582* (2013.01); *H01L 21/02164* (2013.01); *H01L 21/31111* (2013.01); *H01L 27/1157* (2013.01); *H01L 27/11575* (2013.01)

(58) Field of Classification Search
CPC ......... H01L 27/11582; H01L 21/02164; H01L 21/31111; H01L 27/11556

USPC ......................................................... 257/314
See application file for complete search history.

(56) References Cited

U.S. PATENT DOCUMENTS

| | | | | |
|---|---|---|---|---|
| 6,020,024 A | * | 2/2000 | Maiti | ................. H01L 21/28185 |
| | | | | 257/E29.16 |
| 6,590,064 B1 | * | 7/2003 | Mohrschladt | .......... C08G 69/04 |
| | | | | 526/65 |
| 8,455,940 B2 | | 6/2013 | Lee et al. | |
| 8,581,330 B2 | | 11/2013 | Kiyotoshi | |
| 8,674,426 B2 | | 3/2014 | Higuchi et al. | |
| 8,779,499 B2 | | 7/2014 | Kiyotoshi | |
| 2002/0158250 A1 | * | 10/2002 | Fujisaki | ............ H01L 21/28185 |
| | | | | 257/64 |
| 2009/0321816 A1 | * | 12/2009 | Son | .................... H01L 27/11551 |
| | | | | 257/326 |
| 2010/0133606 A1 | * | 6/2010 | Jang | ................... H01L 27/11551 |
| | | | | 257/329 |

(Continued)

*Primary Examiner* — Marc Armand
*Assistant Examiner* — Sue Tang
(74) *Attorney, Agent, or Firm* — Oblon, McClelland, Maier & Neustadt, L.L.P.

(57) ABSTRACT

According to one embodiment, the electrode films are stacked with gaps interposed between the electrode films. The first insulating film is provided between a lowermost electrode film of the electrode films and the substrate and being a metal oxide film, a silicon carbide film, or a silicon carbonitride film. The second insulating film is provided on an uppermost electrode film of the electrode films and being a metal oxide film, a silicon carbide film, or a silicon carbonitride film. The stacked film includes a semiconductor film extending in a stacking direction of the stacked body in the stacked body, and a charge storage film provided between the semiconductor film and the electrode films.

16 Claims, 45 Drawing Sheets

(56) References Cited

U.S. PATENT DOCUMENTS

| | | | |
|---|---|---|---|
| 2012/0052674 A1* | 3/2012 | Lee | H01L 27/11578 |
| | | | 438/591 |
| 2012/0108048 A1* | 5/2012 | Lim | H01L 27/11529 |
| | | | 438/586 |
| 2013/0009150 A1* | 1/2013 | Inoue | H01L 23/49822 |
| | | | 257/43 |
| 2013/0334593 A1* | 12/2013 | Seol | H01L 21/32137 |
| | | | 257/324 |
| 2015/0035039 A1* | 2/2015 | Li | H01L 21/845 |
| | | | 257/316 |
| 2015/0104916 A1* | 4/2015 | Lee | H01L 27/1157 |
| | | | 438/268 |

* cited by examiner

SEMICONDUCTOR DEVICE AND METHOD FOR MANUFACTURING SAME

CROSS-REFERENCE TO RELATED APPLICATION

This application is based upon and claims the benefit of priority from U.S. Provisional Patent Application 62/203,046, filed on Aug. 10, 2015; the entire contents of which are incorporated herein by reference.

FIELD

Embodiments described herein relate generally to a semiconductor device and a method for manufacturing the same.

BACKGROUND

In a three-dimensional memory device having a structure in which a plurality of electrode films is stacked on a substrate, a gap can be provided between electrode films vertically adjacent to each other. This gap can be formed by removing a sacrifice film by etching. A film that is not an object to be etched at this time needs to be formed of a proper material.

DETAILED DESCRIPTION

Figure 1:
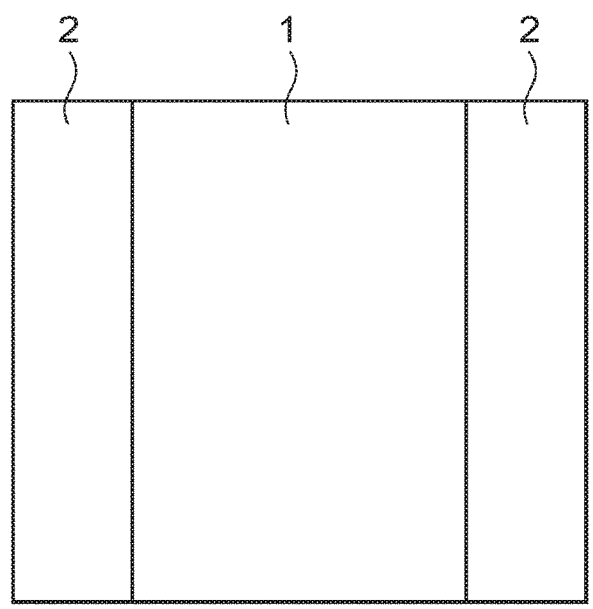
FIG. 1 is a schematic view illustrating a planar layout of a semiconductor device of an embodiment.

According to one embodiment, a semiconductor device includes a substrate, a stacked body, and a stacked film. The stacked body is provided on the substrate. The stacked body includes a plurality of electrode films, a first insulating film, and a second insulating film. The electrode films are stacked with gaps interposed between the electrode films. The first insulating film is provided between a lowermost electrode film of the electrode films and the substrate and being a metal oxide film, a silicon carbide film, or a silicon carbonitride film. The second insulating film is provided on an uppermost electrode film of the electrode films and being a metal oxide film, a silicon carbide film, or a silicon carbonitride film. The stacked film includes a semiconductor film extending in a stacking direction of the stacked body in the stacked body, and a charge storage film provided between the semiconductor film and the electrode films.

Embodiments will now be described with reference to the drawings. The same components are marked with the same reference numerals in the drawings.

In the embodiment, for example, a semiconductor memory device including a memory cell array having a three-dimensional structure will be described as a semiconductor device.

FIG. 1 is a schematic view illustrating a planar layout of a semiconductor device of the embodiment.

The semiconductor device of the embodiment includes a memory cell array 1 and stepped structure portions 2 provided in areas outside the memory cell array 1. The memory cell array 1 and the stepped structure portions 2 are provided on the same substrate.

First, the memory cell array 1 will be described.

Figure 2:
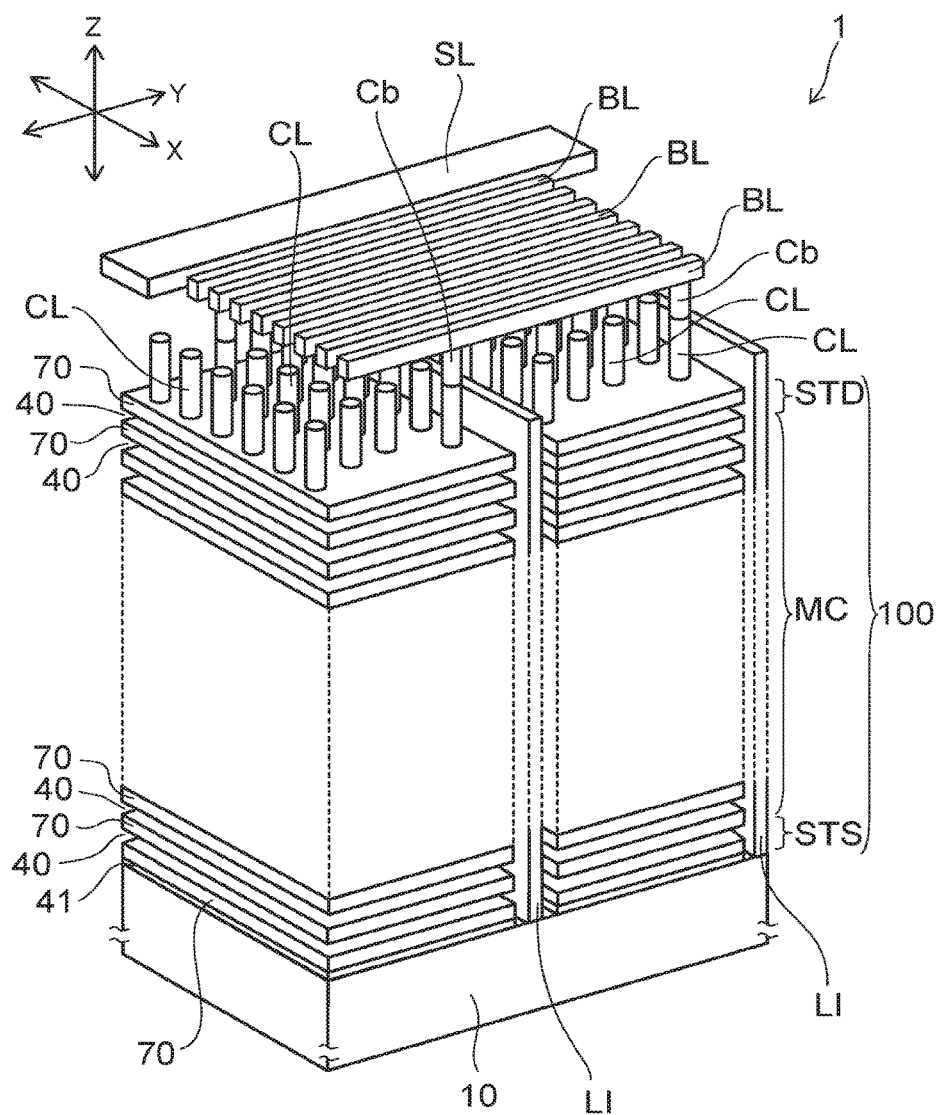
FIG. 2 is a schematic perspective view of a memory cell array of the semiconductor device of the embodiment.

FIG. 2 is a schematic perspective view of the memory cell array 1.

In FIG. 2, two directions parallel to a major surface of the substrate 10 and orthogonal to each other are defined as an X-direction and a Y-direction, and a direction orthogonal to both the X-direction and the Y-direction is defined as a Z-direction (stacking direction).

As shown in FIG. 2, the memory cell array 1 includes the substrate 10, a stacked body 100 provided on the major surface of the substrate 10, a plurality of columnar portions CL, a plurality of conductive portions LI, and an upper layer interconnect provided on the stacked body 100. In FIG. 2, for example, bit lines BL and a source layer SL are shown as the upper layer interconnect.

The columnar portion CL is formed in a circular columnar or elliptical columnar shape extending in the stacking direction (the Z-direction) in the stacked body 100. The conductive portion LI spreads, between the upper layer interconnect and the substrate 10, in the stacking direction (the Z-direction) of the stacked body 100 and the X-direction, and divides the stacked body 100 in the Y-direction.

The plurality of columnar portions CL has, for example, a staggered arrangement. Alternatively, the plurality of columnar portions CL may have a square grid pattern along the X-direction and the Y-direction.

The plurality of bit lines (for example, a metal film) BL is provided on the stacked body 100. The plurality of bit lines BL is separated from each other in the X-direction, and each of the bit lines BL extends in the Y-direction.

An upper end of the columnar portion CL is connected to the bit line BL through a contact portion Cb. A plurality of the columnar portions CL, each of which is selected from each of areas (blocks) separated in the Y-direction by the conductive portion LI is connected to one common bit line BL.

Figure 3:
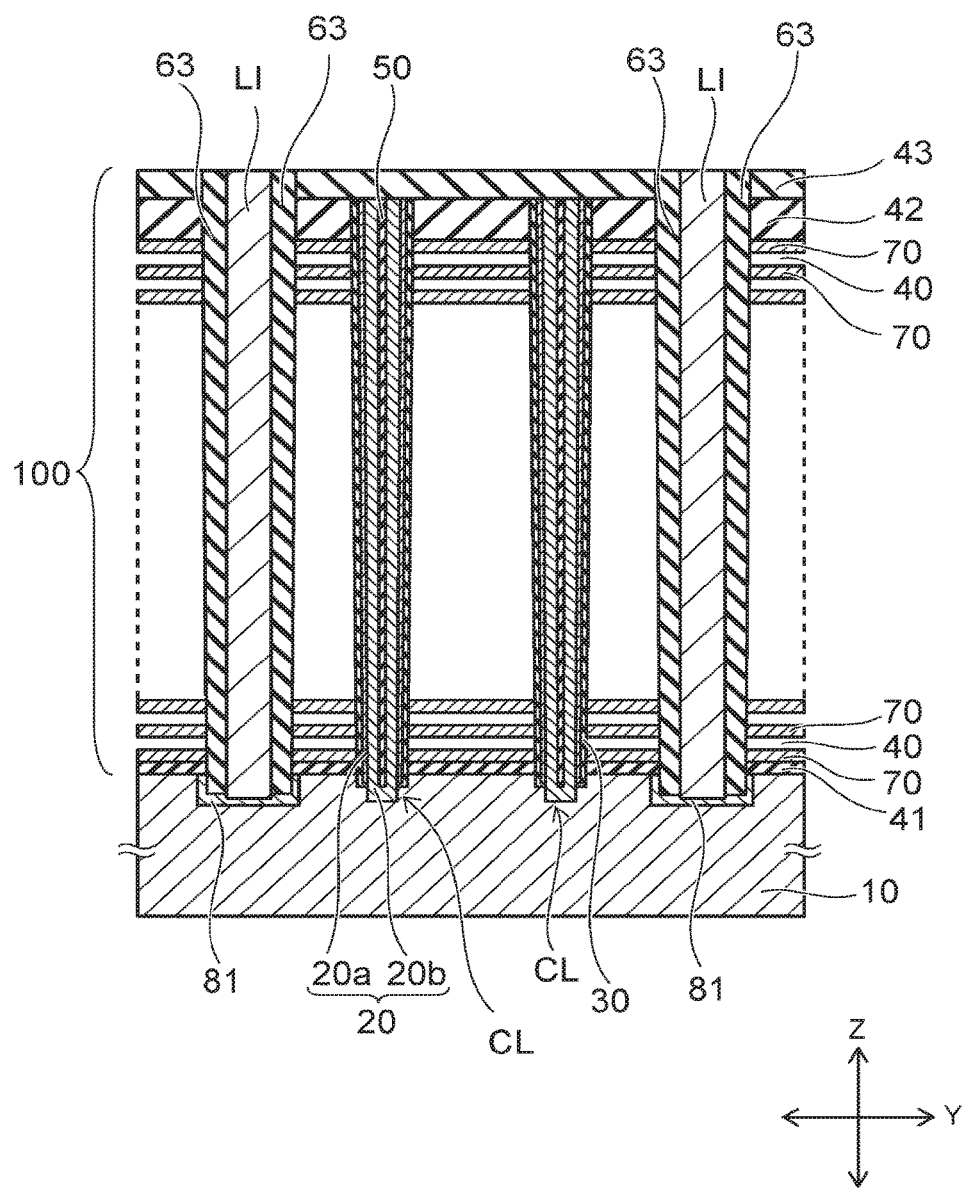
FIG. 3 is a schematic sectional view of the memory cell array of the semiconductor device of the embodiment.

FIG. 3 is a schematic sectional view of the stacked body 100, the columnar portions CL, and the conductive portions LI. The Y-direction and the Z-direction shown in FIG. 3 correspond to the Y-direction and the Z-direction shown in FIG. 2.

The stacked body 100 includes a plurality of electrode films 70 stacked on the major surface of the substrate 10.

The plurality of electrode films 70 is stacked in a direction (the Z-direction) vertical to the major surface of the substrate 10 at a predetermined period with gaps 40 each interposed between the electrode films 70.

The electrode film 70 is a metal film, and is a tungsten film containing, for example, tungsten as a main component.

An insulating film 41 is provided between the major surface of the substrate 10 and the lowermost electrode film 70. The insulating film 41 is in contact with the major surface (surface) of the substrate 10 and the lowermost electrode film 70.

An insulating film 42 is provided on the uppermost electrode film 70, and an insulating film 43 is provided on the insulating film 42. The uppermost electrode film 70 is in contact with the insulating film 42.

Figure 4:
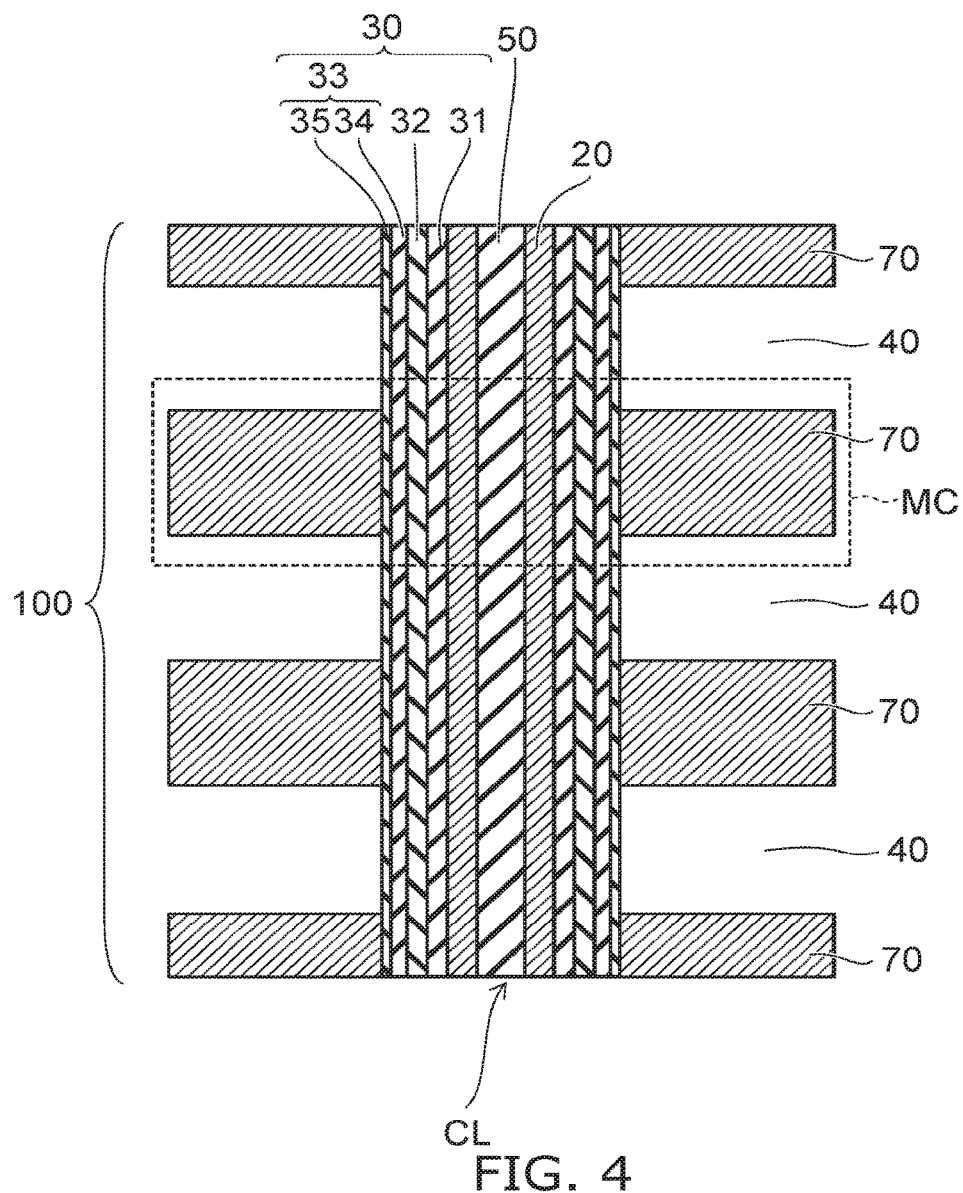
FIG. 4 is an enlarged sectional view of a portion of FIG. 3.

FIG. 4 is an enlarged sectional view of a portion of FIG. 3.

The columnar portion CL is a stacked film including a memory film 30, a semiconductor film 20, and an insulating core film 50. The semiconductor film 20 extends in a pipe-like configuration in the stacking direction (the Z-direction) in the stacked body 100. The memory film 30 is provided between the electrode films 70 and the semiconductor film 20, and is provided around the semiconductor film 20 from the outer circumferential side. The core film 50 is provided inside the semiconductor film 20 having the pipe-like configuration.

An upper end of the semiconductor film 20 is electrically connected to the bit line BL through the contact portion Cb shown in FIG. 2.

The memory film 30 includes a tunnel insulating film 31, a charge storage film 32, and a block insulating film 33. The charge storage film 32, the tunnel insulating film 31, and the semiconductor film 20 extend to be continuous in the stacking direction of the stacked body 100. The block insulating film 33, the charge storage film 32, and the tunnel insulating film 31 are provided between the electrode films 70 and the semiconductor film 20 in order from the electrode film 70 side.

The tunnel insulating film 31 is in contact with the semiconductor film 20. The charge storage film 32 is provided between the block insulating film 33 and the tunnel insulating film 31.

The semiconductor film 20, the memory film 30, and the electrode film 70 are included in a memory cell MC. In FIG. 4, one memory cell MC is illustrated schematically by a broken line. The memory cell MC has a vertical transistor structure in which the electrode film 70 is provided around the semiconductor film 20 with the memory film 30 interposed.

In the memory cell MC having the vertical transistor structure, the semiconductor film 20 functions as a channel, and the electrode film 70 functions as a control gate. The charge storage film 32 functions as a data memory layer that stores electrical charges injected from the semiconductor film 20.

The semiconductor memory device of the embodiment is a non-volatile semiconductor memory device that can freely and electrically erase or write data and retain the memory content even when the power supply is off.

The memory cell MC is, for example, a charge trap type memory cell. The charge storage film 32 has many trap sites that trap electrical charges inside the insulating film, and includes, for example, a silicon nitride film. Alternatively, the charge storage film 32 may be a floating electrode that an insulator is provided around the floating electrode.

The tunnel insulating film 31 serves as a potential barrier when electrical charges are injected from the semiconductor film 20 into the charge storage film 32 or when electrical charges stored in the charge storage film 32 releases into the semiconductor film 20. The tunnel insulating film 31 includes, for example, a silicon oxide film.

The block insulating film 33 prevents the electrical charges stored in the charge storage film 32 from releasing into the electrode film 70. Moreover, the block insulating film 33 suppresses back tunneling of electrons from the electrode film 70 in erasing operation.

The block insulating film 33 includes a first block film 34 and a second block film 35. The first block film 34 is, for example, a silicon oxide film, and in contact with the charge storage film 32. The second block film 35 is provided between the first block film 34 and the electrode film 70, and in contact with the electrode film 70.

The second block film 35 is a film having a dielectric constant higher than a silicon oxide film, and is, for example, a metal oxide film. For example, the second block film 35 is a zirconium oxide film, a hafnium oxide film, or an aluminum oxide film. In the specification, the metal oxide film is a film containing a metal oxide as a main component, and the inclusion of other elements due to, for example, a deposition method or the like into the metal oxide film is not excluded.

As shown in FIG. 2, a drain-side select transistor STD is provided at an upper end portion of the columnar portion CL, and a source-side select transistor STS is provided at a lower end portion. For example, the lowermost electrode film 70 functions as a control gate of the source-side select transistor STS. For example, the uppermost electrode film 70 functions as a control gate of the drain-side select transistor STD.

As shown in FIG. 2, a plurality of the memory cells MC is provided between the drain-side select transistor STD and the source-side select transistor STS. The plurality of memory cells MC, the drain-side select transistor STD, and the source-side select transistor STS are connected in series through the semiconductor film 20 and are included in one memory string. The plurality of memory cells MC is three-dimensionally provided in the X-direction, the Y-direction, and the Z-direction by the memory string having, for example, a staggered arrangement in a surface direction parallel to the X-Y plane.

As shown in FIG. 3, an insulating film 63 is provided on the two side surfaces in Y-direction of the conductive portion LI dividing the stacked body 100 in the Y-direction. The insulating film 63 is provided between the stacked body 100 and the conductive portion LI.

The conductive portion LI is a metal film containing, for example, tungsten as a main component. An upper end of the conductive portion LI is connected to the source layer SL, shown in FIG. 2, provided above the stacked body 100. A lower end of the conductive portion LI is in contact with the substrate 10 as shown in FIG. 3. Moreover, a lower end of the semiconductor film 20 is in contact with the substrate 10. The substrate 10 is, for example, a silicon substrate doped with an impurity and having conductivity. Hence, the lower end of the semiconductor film 20 is electrically connectable to the source layer SL through the substrate 10 and the conductive portion LI.

As shown in FIG. 3, semiconductor areas 81 are formed in the surface of the substrate 10 that contacts the lower end of the conductive portion LI. The plurality of semiconductor areas 81 is provided corresponding to the plurality of conductive portions LI. The plurality of semiconductor areas 81 includes a p-type semiconductor area 81 and an n-type semiconductor area 81. The p-type semiconductor area 81 supplies holes to the semiconductor film 20 through the substrate 10 in erasing operation. In reading operation, electrons are supplied to the semiconductor film 20 from the conductive portion LI through the n-type semiconductor area 81 and the substrate 10.

By controlling a potential applied to the lowermost electrode film 70 provided on the surface (major surface) of the substrate 10 with the insulating film 41 interposed between the surface of the substrate 10 and the lowermost electrode film 70, a channel is induced at the surface of the substrate 10 between the semiconductor area 81 and the lower end of the semiconductor film 20, and a current can be caused to flow between the semiconductor area 81 and the lower end of the semiconductor film 20.

The lowermost electrode film 70 functions as a control gate for inducing a channel at the surface of the substrate 10, and the insulating film 41 functions as a gate insulating film. Since not a gap but the insulating film 41 having a dielectric constant higher than the air is provided between the surface of the substrate 10 and the lowermost electrode film 70, high-speed driving due to capacitive coupling between the lowermost electrode film 70 and the surface of the substrate 10 is possible.

For example, the insulating film 41 is a metal oxide film, a silicon carbide film (SiC film), or a silicon carbonitride film (SiCN film). The metal oxide film used for the insulating film 41 contains, for example, at least any of tantalum oxide (TaO), zirconium oxide (ZrO), and hafnium oxide (HfO).

On the other hand, the gap 40 is made between the control gates (the electrode films 70) of the memory cells adjacent to each other in the stacking direction (the Z-direction). For this reason, it is possible to suppress interference between the adjacent cells, such as a threshold fluctuation due to capacitive coupling between the electrode films 70 adjacent to each other in the stacking direction.

Next, the stepped structure portion 2 will be described.

In the stacked body 100, the insulating film 42 and the insulating film 43 are provided on the uppermost electrode film 70. The insulating films 42 and 43 are each a metal oxide film, a silicon carbide film (SiC film), or a silicon carbonitride film (SiCN film). The metal oxide film used for the insulating films 42 and 43 contains, for example, at least any of tantalum oxide (TaO), zirconium oxide (ZrO), and hafnium oxide (HfO). The insulating film 42 and the insulating film 43 are made of the same material. Alternatively, the insulating film 42 and the insulating film 43 may be made of different materials.

Figure 5:
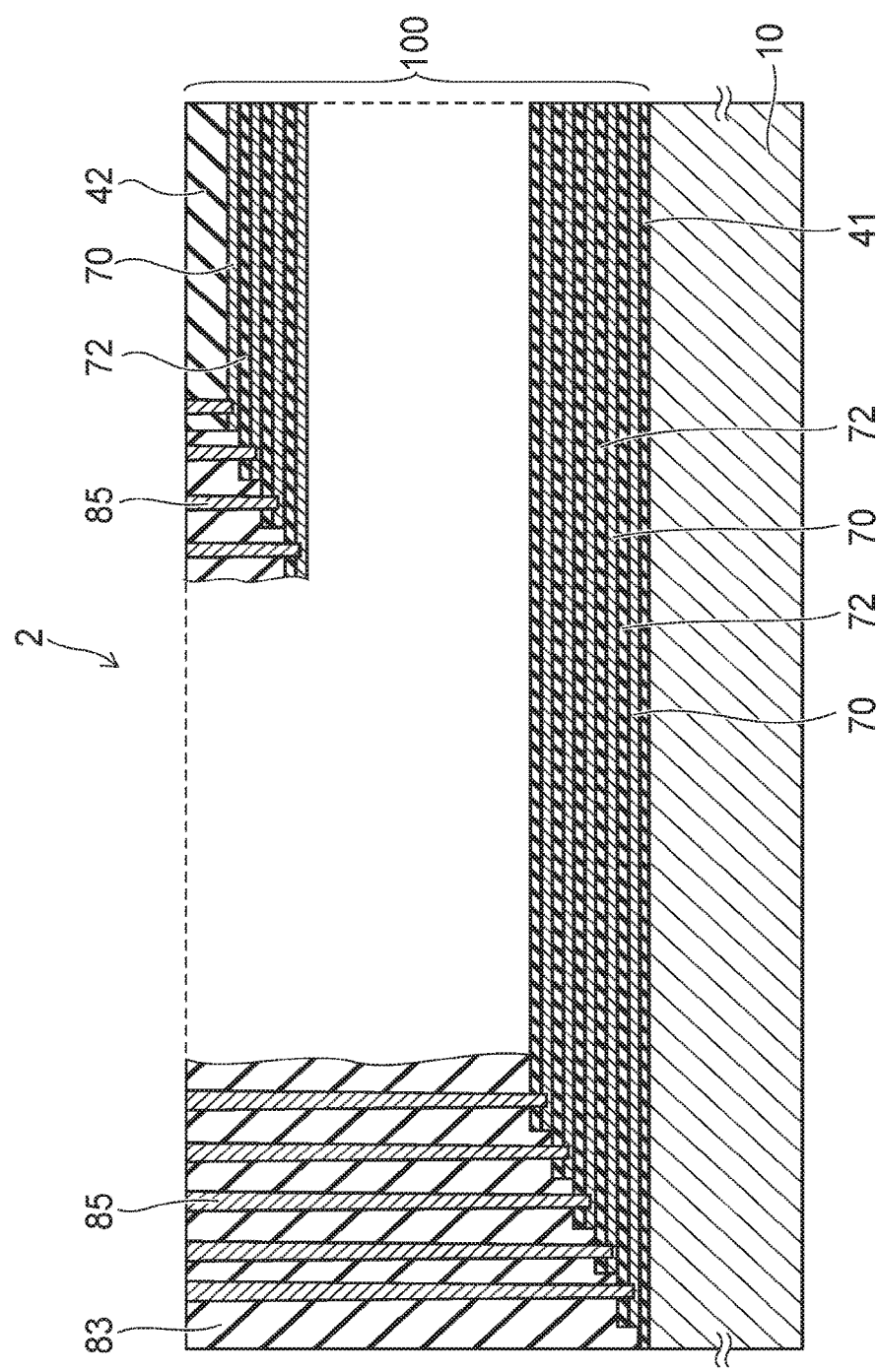
FIG. 5 is a schematic sectional view of a stepped structure portion of the semiconductor device of the embodiment.

FIG. 5 is a schematic sectional view of the stepped structure portion 2.

The stacked body 100 including the plurality of electrode films 70 is also provided in the stepped structure portion 2. In the stepped structure portion 2, however, not the gap 40 but an insulating film 72 is provided between the electrode films 70. The insulating film 72 is, for example, a silicon oxide film containing silicon oxide as a main component.

A portion of the stacked body 100 including the plurality of electrode films 70 and a plurality of the insulating films 72 is processed into a stepped pattern as shown in FIG. 5.

An inter-layer insulating film 83 covers the stepped structure portion 2. A plurality of vias (plugs) 85 is provided on the stepped structure portion 2. Each of the vias 85 pierces the inter-layer insulating film 83 and the insulating film 72 at each step to reach the electrode film 70 at each step.

The via 85 is formed of a conductive film containing a metal, and each of the vias 85 is electrically connected with the electrode film 70 at each step. Each of the vias 85 is connected with the upper layer interconnect (not shown) provided on the stacked body 100.

The respective electrode films 70 of the stepped structure portion 2 are integrally connected with the respective electrode films 70 of the memory cell array 1. Hence, the electrode film 70 of the memory cell array 1 is connected with the upper layer interconnect through the via 85 of the stepped structure portion 2. The upper layer interconnect is connected with a control circuit formed on, for example, the surface of the substrate 10, and the control circuit controls the operation of the memory cell array 1.

Next, a method for forming the memory cell array 1 of the embodiment will be described with reference to FIG. 6 to FIG. 17.

Figure 6:
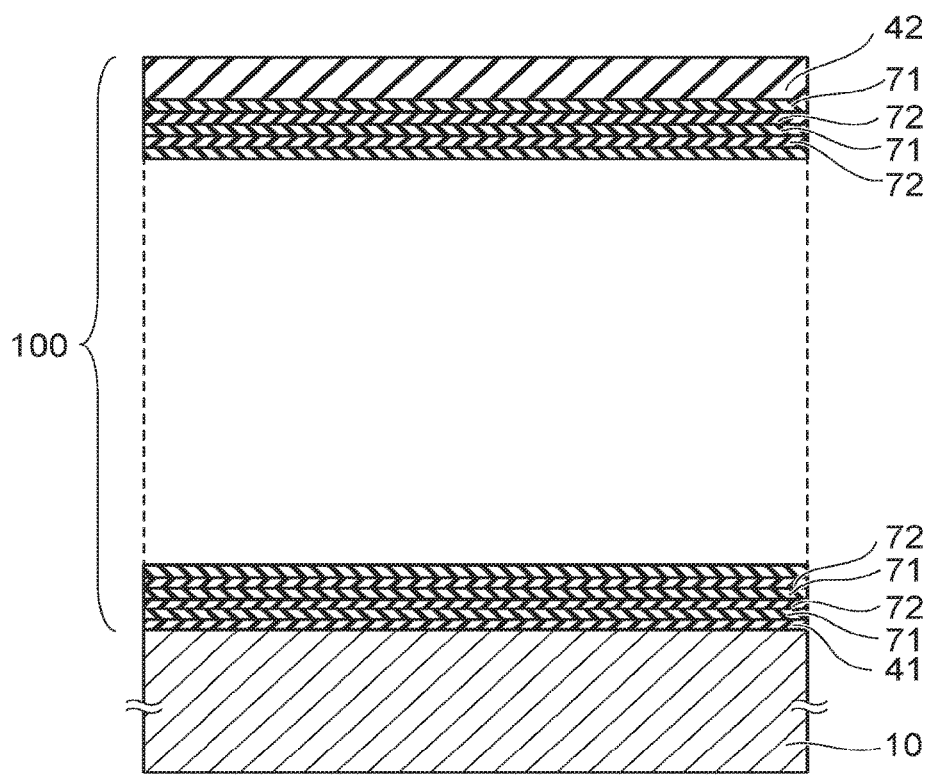
FIGS. 6 to 19 are schematic sectional views showing a method for manufacturing the semiconductor device of the embodiment.

As shown in FIG. 6, the stacked body 100 is formed on the substrate 10. The substrate 10 is, for example, a semiconductor substrate, and is a silicon substrate.

The insulating film 41 is formed on the major surface (surface) of the substrate 10, and a first sacrifice film 71 and a second sacrifice film 72 are alternately stacked on the insulating film 41. The process of alternately stacking the first sacrifice film 71 and the second sacrifice film 72 is repeated, so that a plurality of the first sacrifice films 71 and a plurality of the second sacrifice films 72 are formed on the substrate 10. For example, the first sacrifice film 71 is a silicon nitride film, and the second sacrifice film 72 is a silicon oxide film.

The lowermost first sacrifice film 71 is formed on the insulating film 41, and the lowermost second sacrifice film 72 is formed on the lowermost first sacrifice film 71.

The insulating film 42 is formed on the uppermost first sacrifice film 71. The uppermost first sacrifice film 71 is formed between the uppermost second sacrifice film 72 and the insulating film 42.

The insulating film 41 and the insulating film 42 are made of the material described above.

Figure 7:
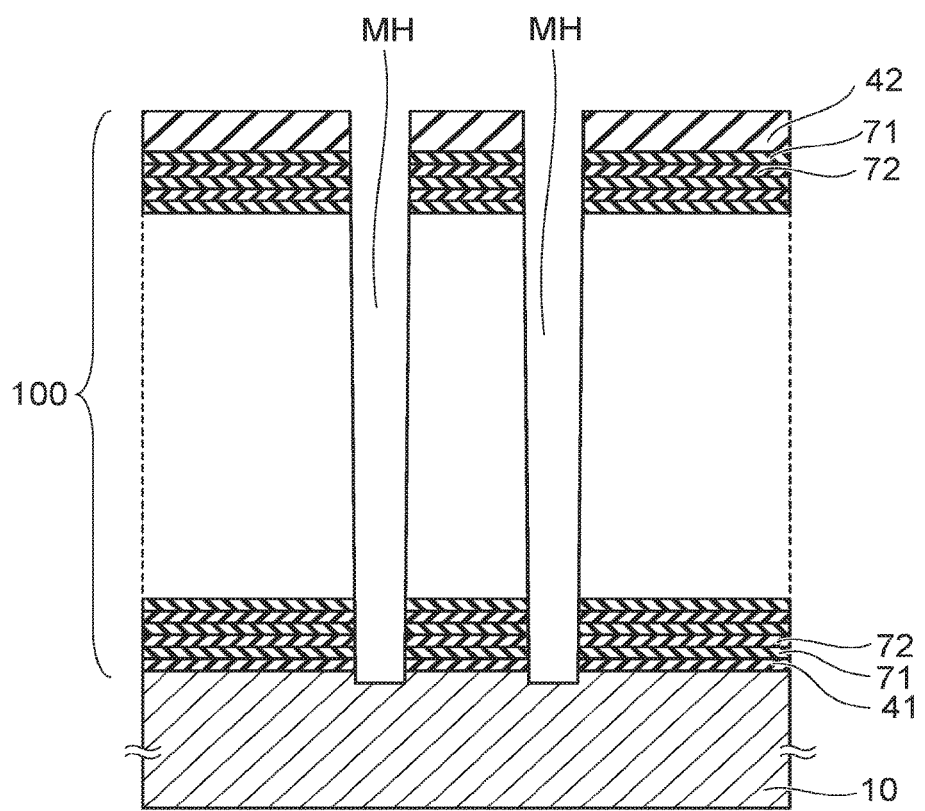

Next, as shown in FIG. 7, a plurality of memory holes MH is made in the stacked body 100. The memory hole MH is made by a RIE method using a mask (not shown). The memory hole MH pierces the stacked body 100 to reach the substrate 10.

The plurality of first sacrifice films (silicon nitride films) 71 and the plurality of second sacrifice films (silicon oxide films) 72 are successively etched by, for example, a RIE method using a gas containing fluorine without switching the gas. This enables high-throughput processing.

Figure 8:
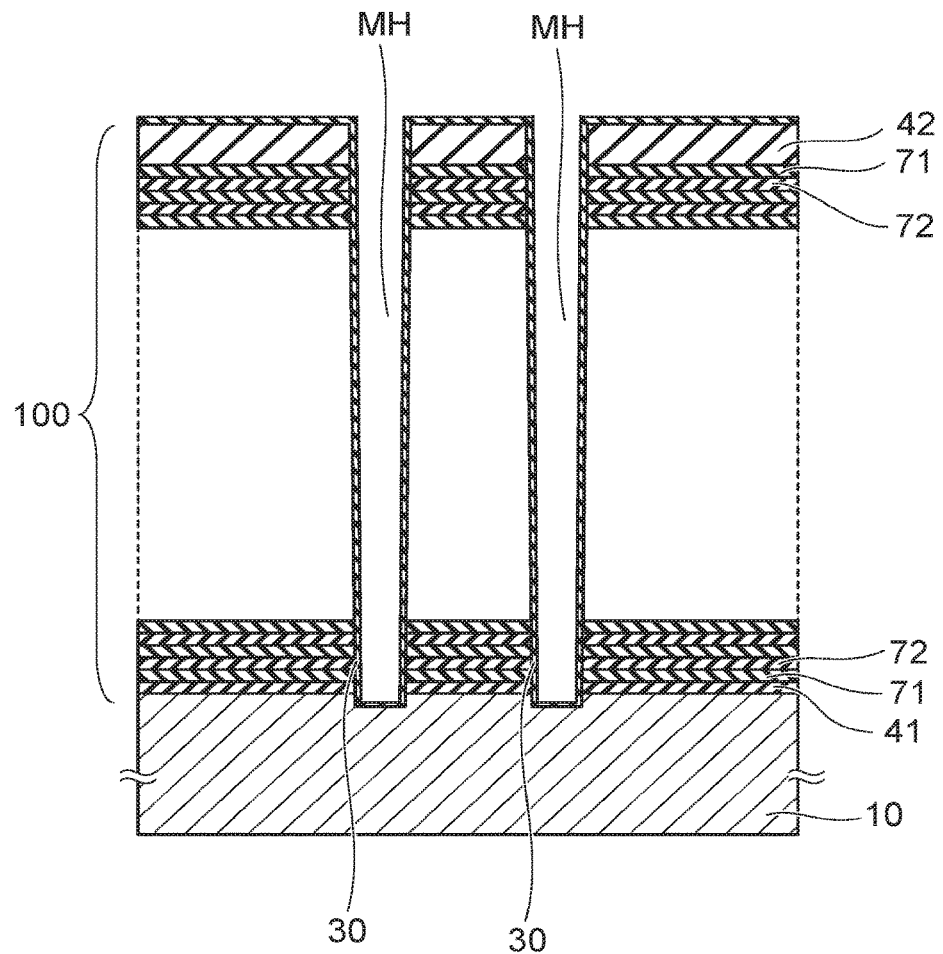
Figure 9:
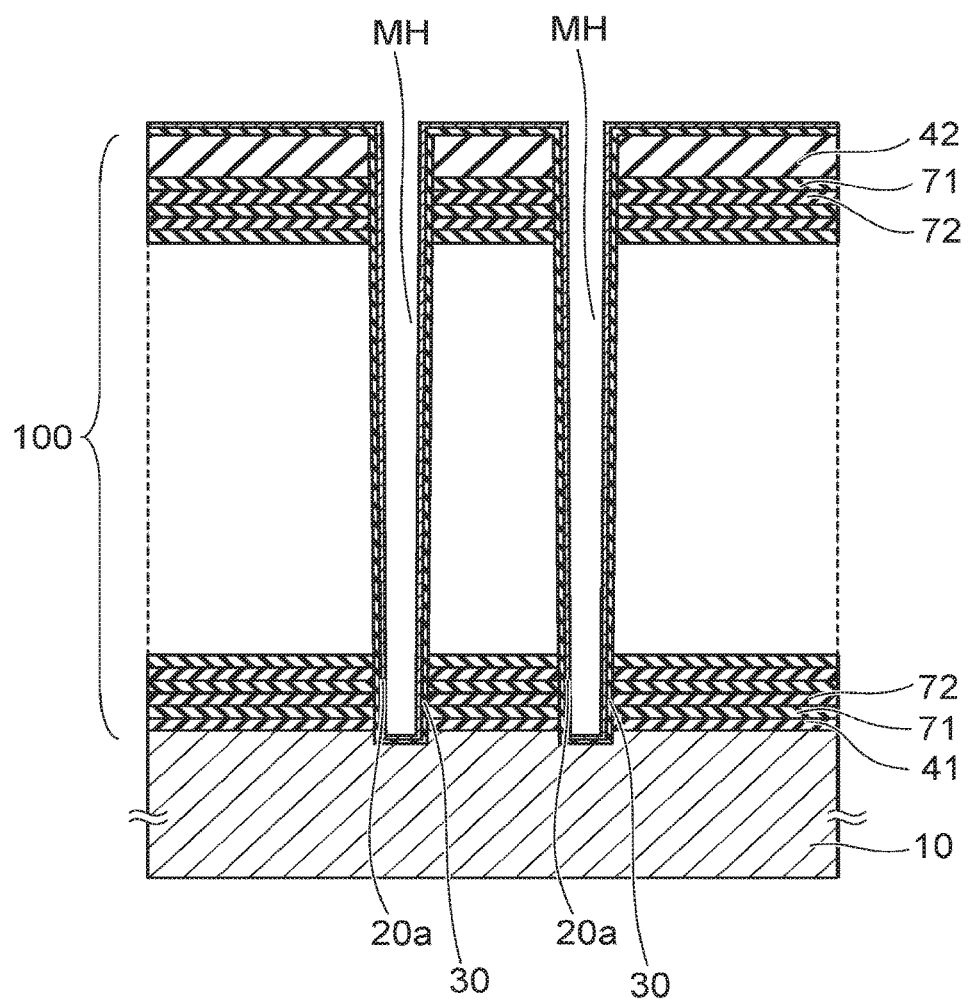

As shown in FIG. 8, the memory film 30 is formed on a side surface and a bottom of the memory hole MH, and as shown in FIG. 9, a cover film 20a is formed inside the memory film 30.

Figure 10:
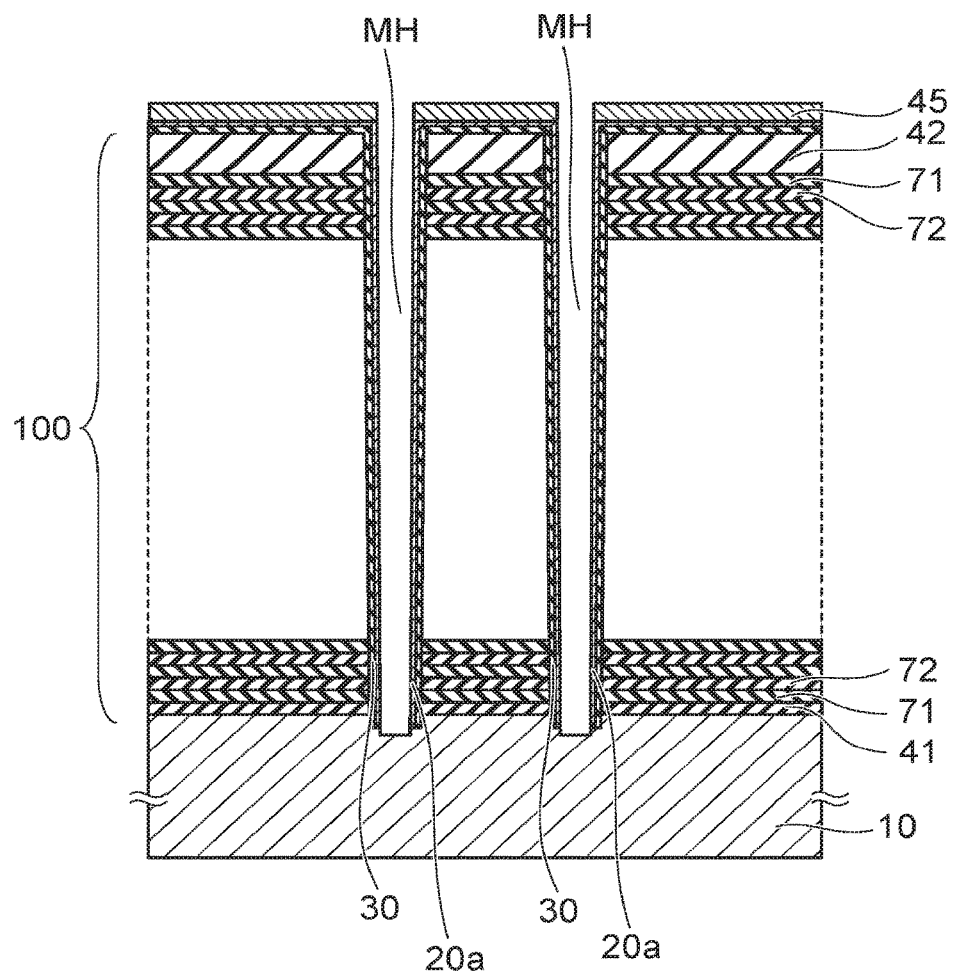

As shown in FIG. 10, a mask layer 45 is formed on an upper surface of the stacked body 100, and the cover film 20a and the memory film 30 formed on the bottom of the memory hole MH are removed by a RIE method. In this RIE, the memory film 30 formed on the side surface of the memory hole MH is covered with the cover film 20a and protected thereby. Hence, the memory film 30 formed on the side surface of the memory hole MH is not damaged by RIE.

Figure 11:
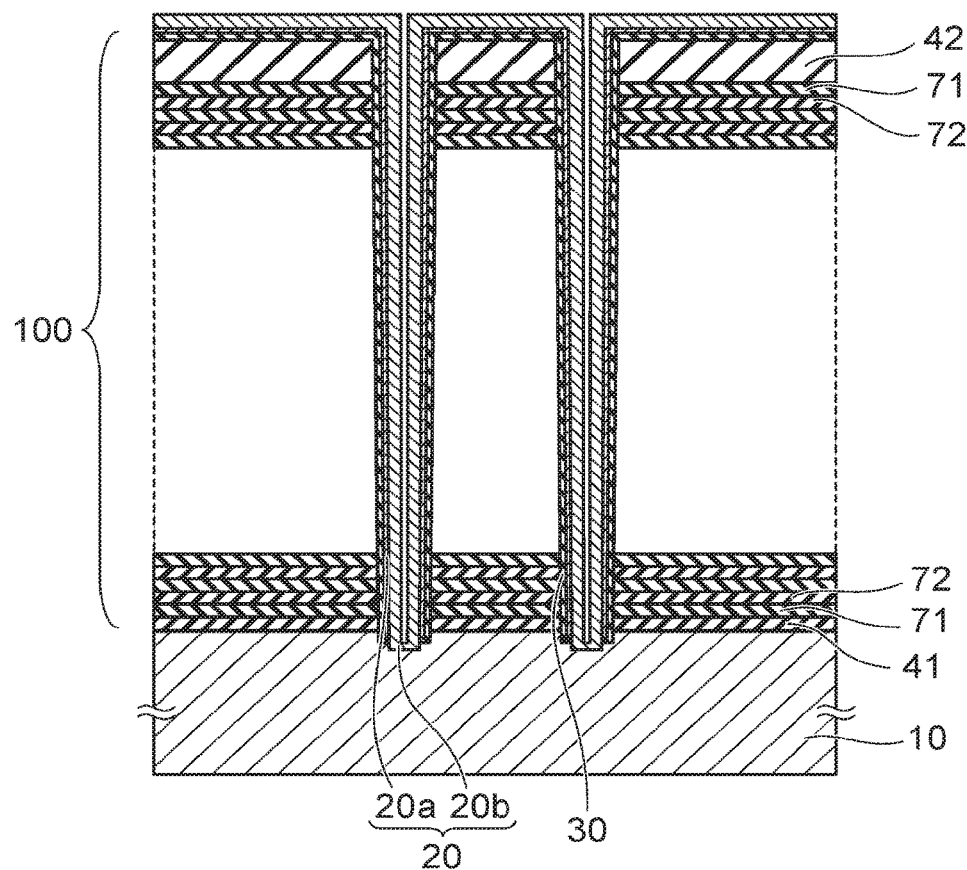

After the mask layer 45 is removed, a semiconductor film 20b is formed in the memory hole MH as shown in FIG. 11. The semiconductor film 20b is formed on a side surface of the cover film 20a and the bottom of the memory hole MH at which the substrate 10 is exposed.

The cover film 20a and the semiconductor film 20b are formed as, for example, amorphous silicon films, and then crystallized into a polycrystalline silicon film by thermal annealing. The cover film 20a and the semiconductor film 20b are included in a portion of the semiconductor film 20 described above.

Figure 12:
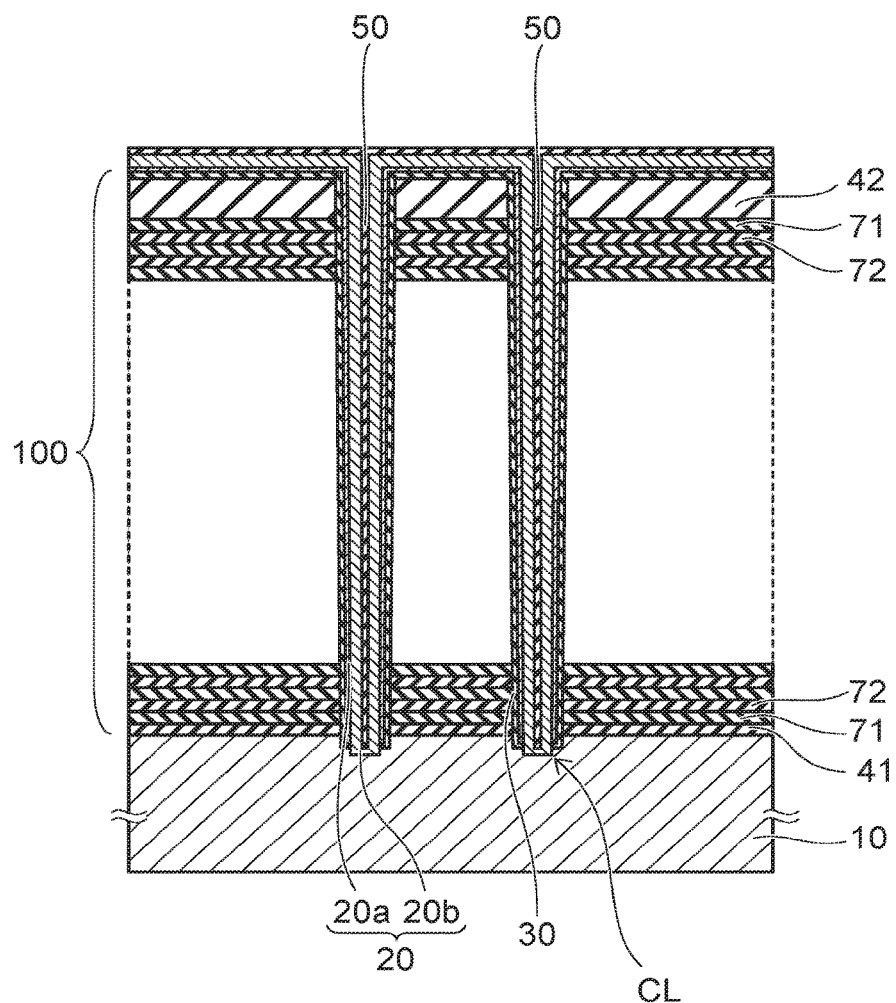

As shown in FIG. 12, the core film 50 is formed inside the semiconductor film 20b, whereby the columnar portion CL is formed.

Figure 13:
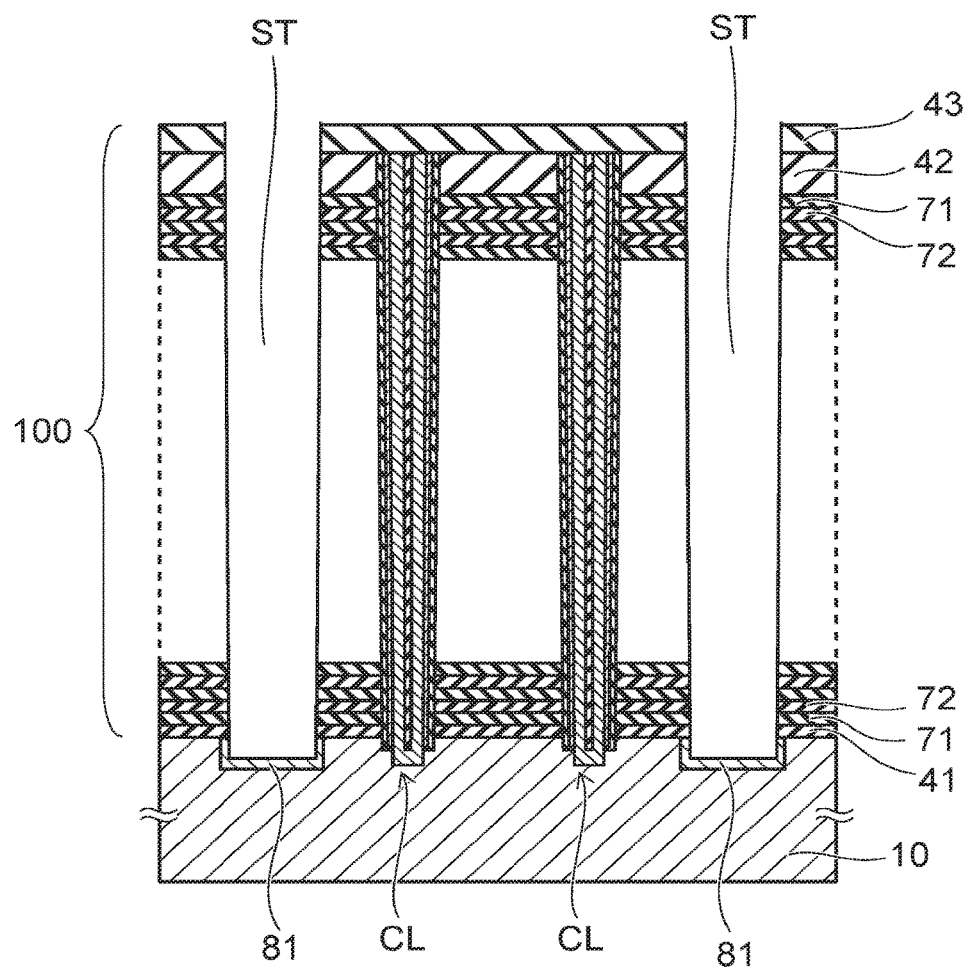

The films deposited on the insulating film 42 shown in FIG. 12 are removed by Chemical Mechanical Polishing (CMP) or etch-back. Subsequently, as shown in FIG. 13, the insulating film 43 is formed on the insulating film 42. The insulating film 43 covers an upper end of the stacked film configuring the columnar portion CL. The insulating film 43 is made of the material described above.

Then, a plurality of slits ST is made, by a RIE method using a mask (not shown), in the stacked body 100 including the insulating films 43 and 42, the sacrifice films 71 and 72, and the insulating film 41. As shown in FIG. 13, the slit ST pierces the stacked body 100 to reach the substrate 10. In the same manner as making the memory hole MH, the plurality of first sacrifice films (silicon nitride films) 71 and the plurality of second sacrifice films (silicon oxide films) 72 are successively etched by, for example, a RIE method using a gas containing fluorine.

An impurity is implanted by an ion implantation method into the substrate 10 exposed at a bottom of the slit ST, so that the p-type or n-type semiconductor area 81 is formed in the surface of the substrate 10 at the bottom of the slit ST.

Figure 14:
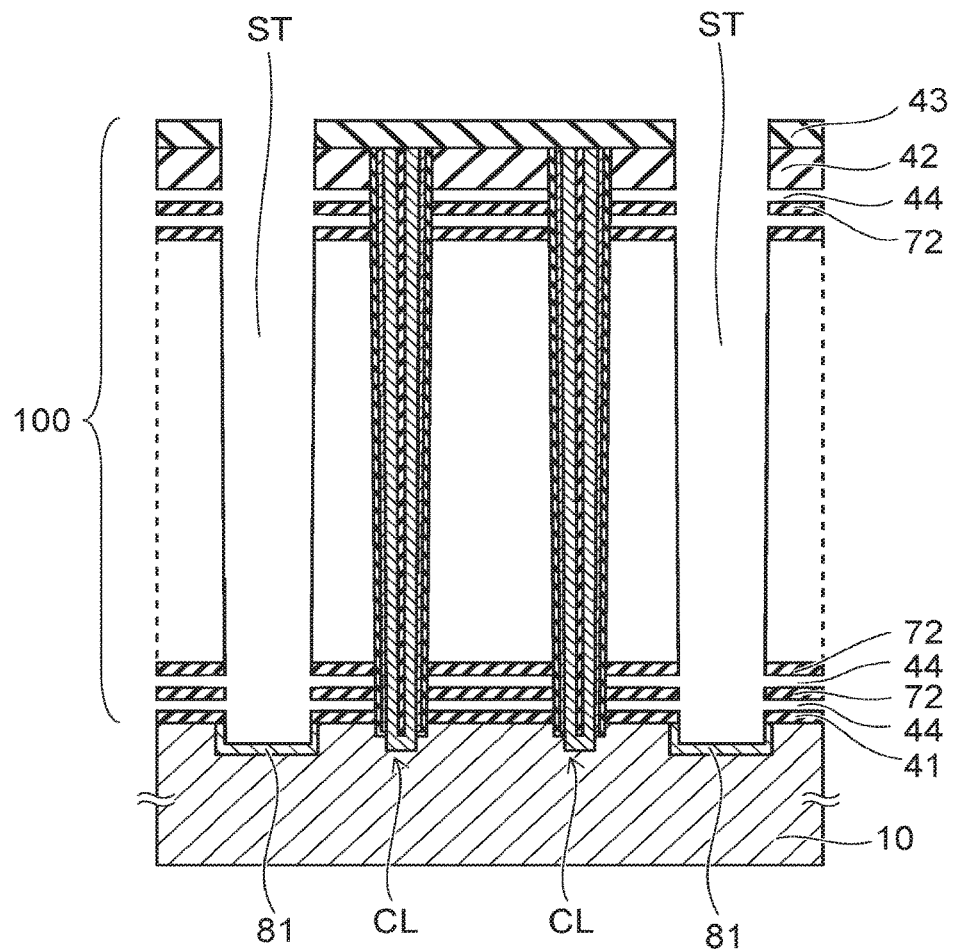

Next, the first sacrifice films 71 are removed with an etchant supplied through the slits ST. With the removal of the first sacrifice films 71 as shown in FIG. 14, gaps 44 are made between the second sacrifice films 72 vertically adjacent to each other.

For example, the first sacrifice film 71, which is a silicon nitride film, is removed with an etchant containing phosphoric acid.

The etching selectivity of the first sacrifice film (silicon nitride film) 71 with respect to the second sacrifice film (silicon oxide film) 72, the insulating films (metal oxide films, SiC films, or SiCN films) 41, 42, and 43, and the substrate (silicon substrate) 10 is sufficiently high. That is, the second sacrifice film 72, the insulating films 41, 42, and 43, and the substrate 10 have high etching resistance to phosphoric acid, and are left without being etched.

For example, when the etching rate of SiN, formed by a plasma CVD method, with phosphoric acid is 1, the etching rate of SiC, SiCN, TaO, ZrO, and HfO with phosphoric acid is 1/30 or less.

Moreover, because the block film 35 provided at the outermost circumference of the columnar portion CL is a metal oxide film, etching of a side surface of the columnar portion CL due to phosphoric acid entering through the gap 44 is suppressed.

Further, because an upper end of the columnar portion CL is covered with the insulating film 43, etching from the upper end side of the columnar portion CL can also be suppressed.

The plurality of second sacrifice films 72 stacked with the gaps 44 therebetween is supported by the columnar portion CL. Moreover, a lower end of the columnar portion CL is supported by the substrate 10, and the upper end is supported by the insulating films 42 and 43.

After the first sacrifice films 71 are removed, the electrode films 70 are formed in the gaps 44. The electrode films 70 are formed by, for example, a CVD (Chemical Vapor Deposition) method. A source gas enters the gaps 44 through the slits ST, and the electrode films 70 are deposited in the gaps 44.

Figure 15:
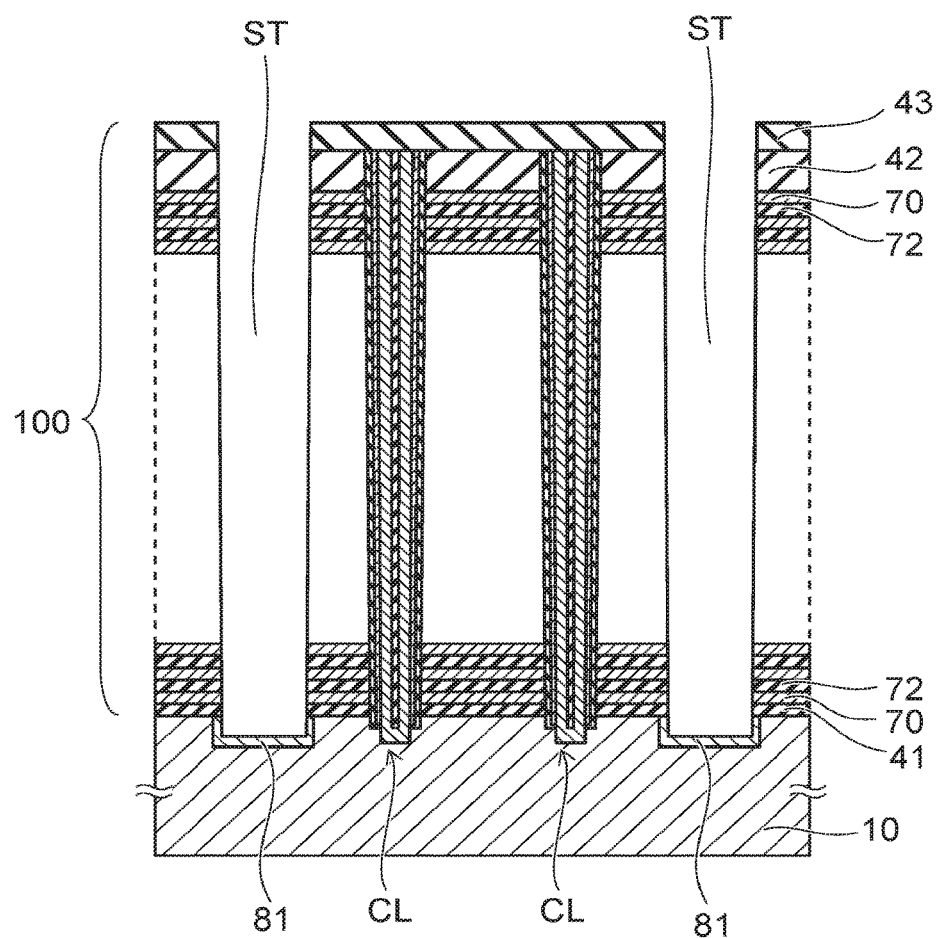

As shown in FIG. 15, the electrode film 70 is formed between the second sacrifice films 72. The second sacrifice films 72 and the electrode films 70 are alternately stacked, so that the stacked body 100 including the plurality of electrode films 70 and the plurality of second sacrifice films 72 is formed.

Figure 16:
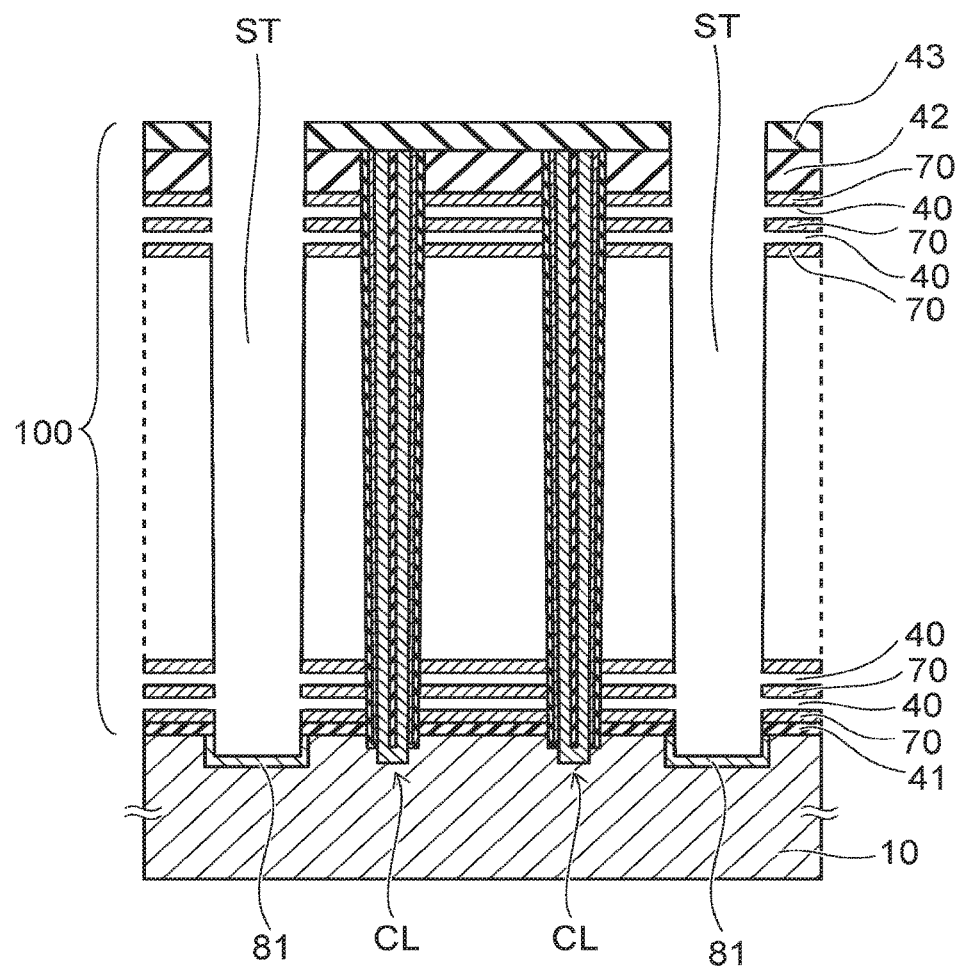

Next, the second sacrifice films 72 are removed with an etchant supplied through the slits ST. By the removal of the second sacrifice film 72, the gap 40 is made between the electrode films 70 vertically adjacent to each other as shown in FIG. 16.

For example, the second sacrifice film 72, which is a silicon oxide film, is removed with an etchant containing hydrofluoric acid.

The etching selectivity of the second sacrifice film 72 with respect to the electrode film 70, the insulating films 41, 42, and 43, and the substrate 10 is sufficiently high. That is, the electrode film 70, the insulating films 41, 42, and 43, and the substrate 10 have high etching resistance to hydrofluoric acid, and are left without being etched.

For example, when the etching rate of $SiO_2$, formed by a plasma CVD method, with hydrofluoric acid is 1, the etching rate of SiC, SiCN, TaO, ZrO, and HfO with hydrofluoric acid is 1/30 or less.

Moreover, because the block film 35 provided at the outermost circumference of the columnar portion CL is a metal oxide film, etching of the side surface of the columnar portion CL due to hydrofluoric acid entering through the gap 40 is suppressed.

Further, because the upper end of the columnar portion CL is covered with the insulating film 43, etching from the upper end side of the columnar portion CL can also be suppressed.

The plurality of electrode films 70 stacked with the gaps 40 each interposed therebetween is supported by the columnar portion CL.

Figure 17:
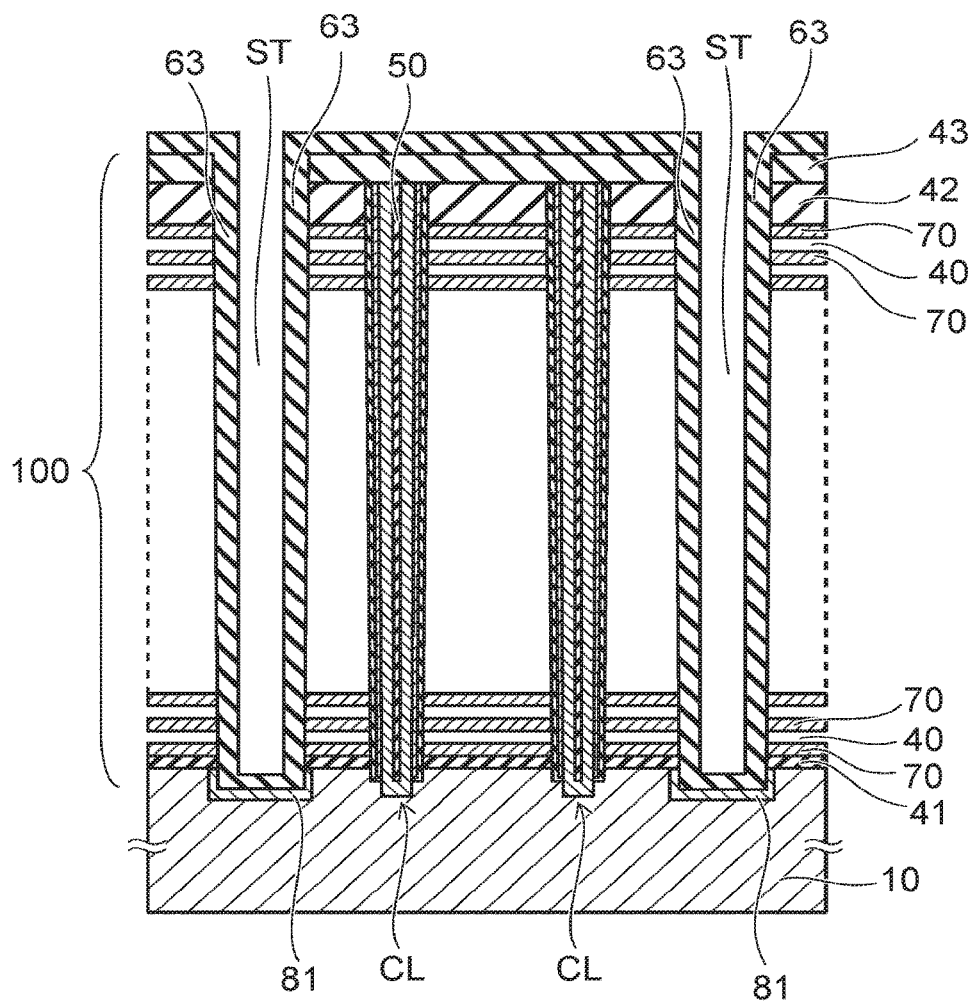

After the gaps 40 are made, the insulating film 63 is formed on a side surface and a bottom of the slit ST as shown in FIG. 17.

The insulating film 63 with low coverage closes openings of the gaps 40 on the slit ST side. The gaps 40 are not filled with the insulating film 63.

After the insulating film 63 formed on the bottom of the slit ST is removed by a RIE method, the conductive portion LI is buried in the slit ST as shown in FIG. 3. The lower end of the conductive portion LI is connected to the substrate 10 through the semiconductor area 81. Thereafter, the bit lines BL, the source layer SL, and the like shown in FIG. 2 are formed.

Slits (not shown) are also made in the stacked body 100 of the stepped structure portion 2 shown in FIG. 5, the first sacrifice films 71 are removed through the slits, and the electrode films 70 are formed.

In a state where, for example, the slit made in the stacked body 100 of the stepped structure portion 2 is filled with a resist film, the second sacrifice films 72 of the memory cell array 1 are etched. Hence, gaps are not made between the electrode films 70 of the stacked body 100 of the stepped structure portion 2, and the insulating films (silicon oxide films) 72 are left.

The electrode films 70 is not limited to being formed by replacing the sacrifice films, and may be stacked on the substrate 10 prior to making the memory hole MH.

Figure 18:
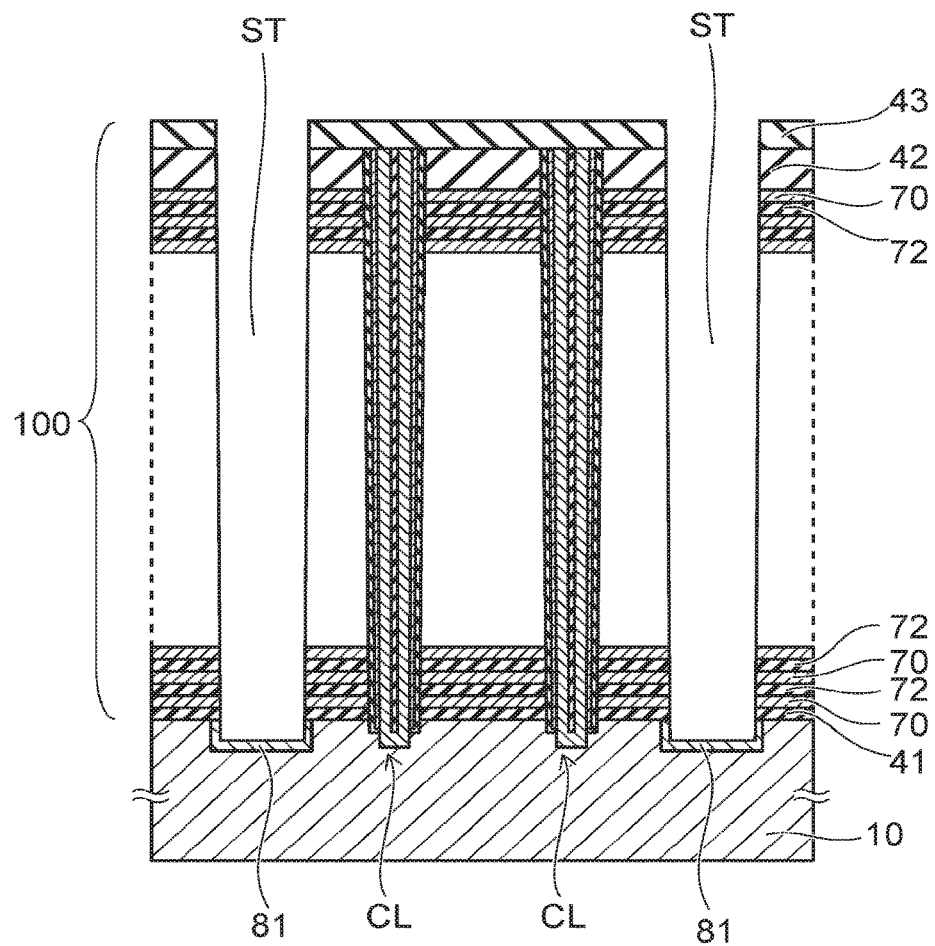

That is, the electrode films 70 and the sacrifice films (silicon oxide films) 72 are alternately stacked as the stacked body 100 on the substrate 10. As shown in FIG. 18, the insulating film 41 is formed on the major surface of the substrate 10, and the lowermost electrode film 70 is formed on the insulating film 41. The sacrifice films 72 and the electrode films 70 are alternately stacked on the lowermost electrode film 70. The insulating film 42 is formed on the uppermost electrode film 70, and the insulating film 43 is formed on the insulating film 42.

The memory holes MH and the columnar portions CL are formed in the stacked body 100, and further, as shown in FIG. 18, the slits ST are formed.

Figure 19:
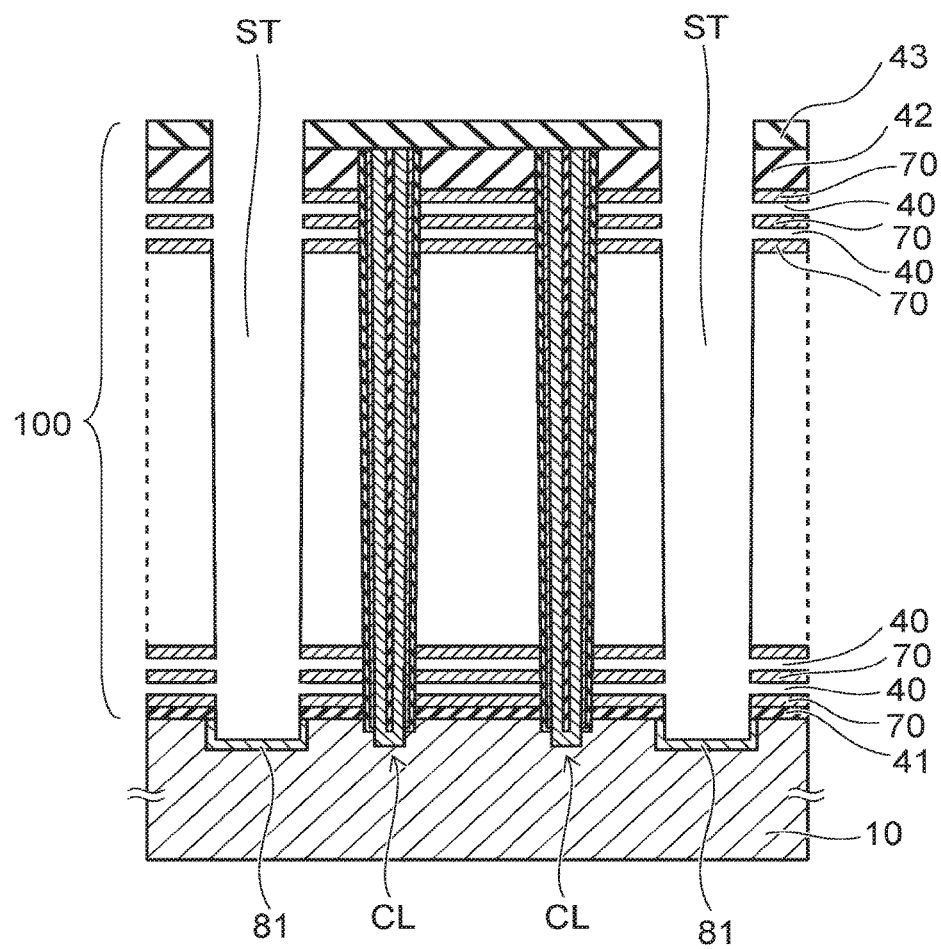

Then, the second sacrifice films 72 are removed with an etchant supplied through the slits ST. By the removal of the second sacrifice films 72, the gap 40 is made between the electrode films 70 vertically adjacent to each other as shown in FIG. 19.

For example, the second sacrifice film 72, which is a silicon oxide film, is removed with a hydrofluoric acid-containing etchant. The electrode film 70, the insulating films (metal oxide films, SiC films, or SiCN films) 41, 42, and 43, and the substrate 10 are left without being etched.

After this, the insulating film 63 and the conductive portion LI are formed in the slit ST.

In the process of etching the sacrifice films 72 of the memory cell array shown in FIG. 18, the sacrifice films (insulating films) 72 of the stepped structure portion 2 shown in FIG. 5 are left without being etched.

Hereinafter, another example of a memory cell array in the semiconductor device of the embodiment will be described.

Figure 20:
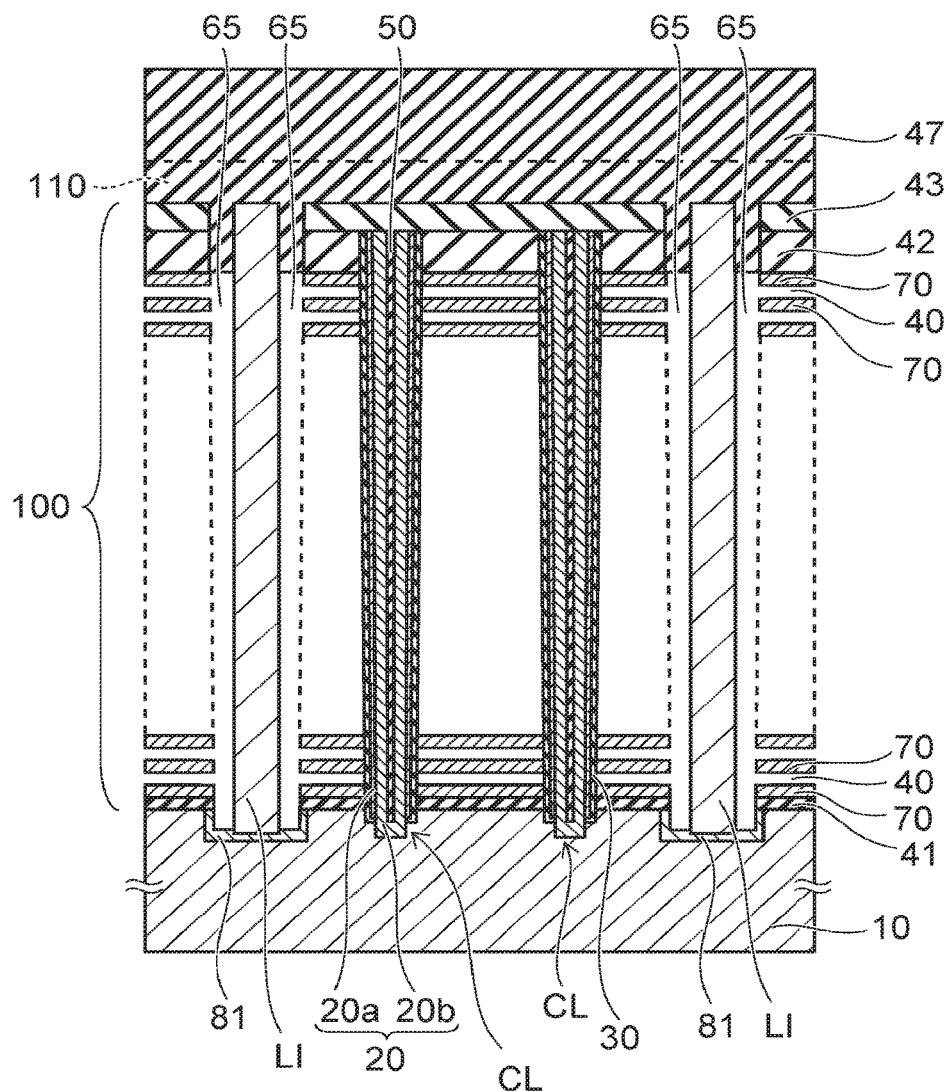
FIG. 20 is a schematic perspective view of a memory cell array of the semiconductor device of the embodiment.

FIG. 20 is a schematic sectional view similar to FIG. 3.

In the example shown in FIG. 20, gaps are each provided also between the side surface of the conductive portion LI and the stacked body 100. Slits 65 extending in the stacking direction and in a depth direction of this paper (the X-direction in FIG. 2) are each made between the side surface of the conductive portion LI and the stacked body 100. The slit 65 is in communication with the gaps 40.

An insulating film 47 is provided on the insulating film 43, and a portion of the insulating film 47 closes an upper end of the slit 65. By forming, for example, a silicon oxide film with low coverage as the insulating film 47, the slits 65 are prevented from being filled with the insulating film 47.

Edge portions of the electrode films 70 vertically adjacent to each other on the conductive portion LI side are not connected to each other through a surface of the insulating film. Therefore, it is possible to prevent a short circuit between the electrode films 70 due to migration occurring on the surface of the insulating film.

Next, with reference to FIG. 21 to FIG. 27B, a method for forming the memory cell array shown in FIG. 20 will be described.

Figure 21:
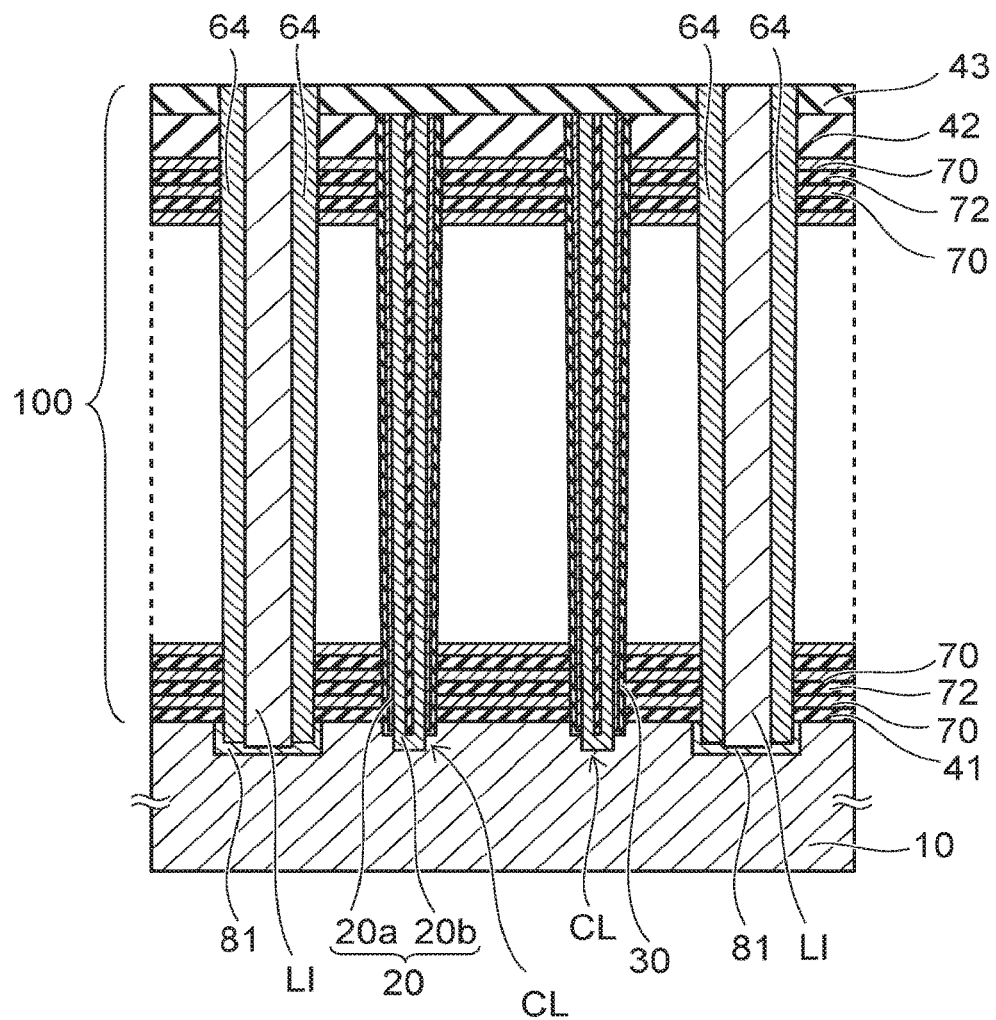
FIGS. 21 to 27B are schematic sectional views showing a method for manufacturing the semiconductor device of the embodiment.

The electrode films 70 and the sacrifice films (silicon oxide films) 72 are alternately stacked as the stacked body 100 on the substrate 10. As shown in FIG. 21, the insulating film 41 is formed on the major surface of the substrate 10, and the lowermost electrode film 70 is formed on the insulating film 41. The sacrifice films 72 and the electrode films 70 are alternately stacked on the lowermost electrode film 70. The insulating film 42 is formed on the uppermost electrode film 70, and the insulating film 43 is formed on the insulating film 42.

The memory holes MH and the columnar portions CL are made in the stacked body 100, slits are further made therein, and a sacrifice film 64 and the conductive portion LI are formed in the slits.

The sacrifice film 64 is formed on a side surface and a bottom of the slit, and the conductive portion LI is buried in the slit after the sacrifice film 64 on the bottom is removed. The sacrifice film 64 is formed on the side surface of the conductive portion LI.

The sacrifice film 64 is, for example, a BSG (Boron-Silicate Glass) film or a silicon nitride film. Alternatively, the sacrifice film 64 is a stacked film of a silicon oxide film formed on the side surface of the conductive portion LI and a silicon nitride film formed on a side surface of the silicon oxide film.

Figure 22A:
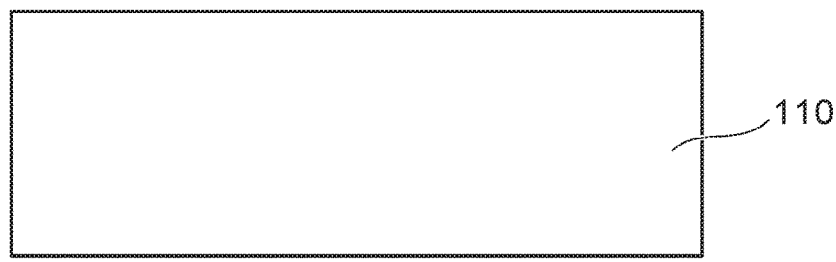
Figure 22B:
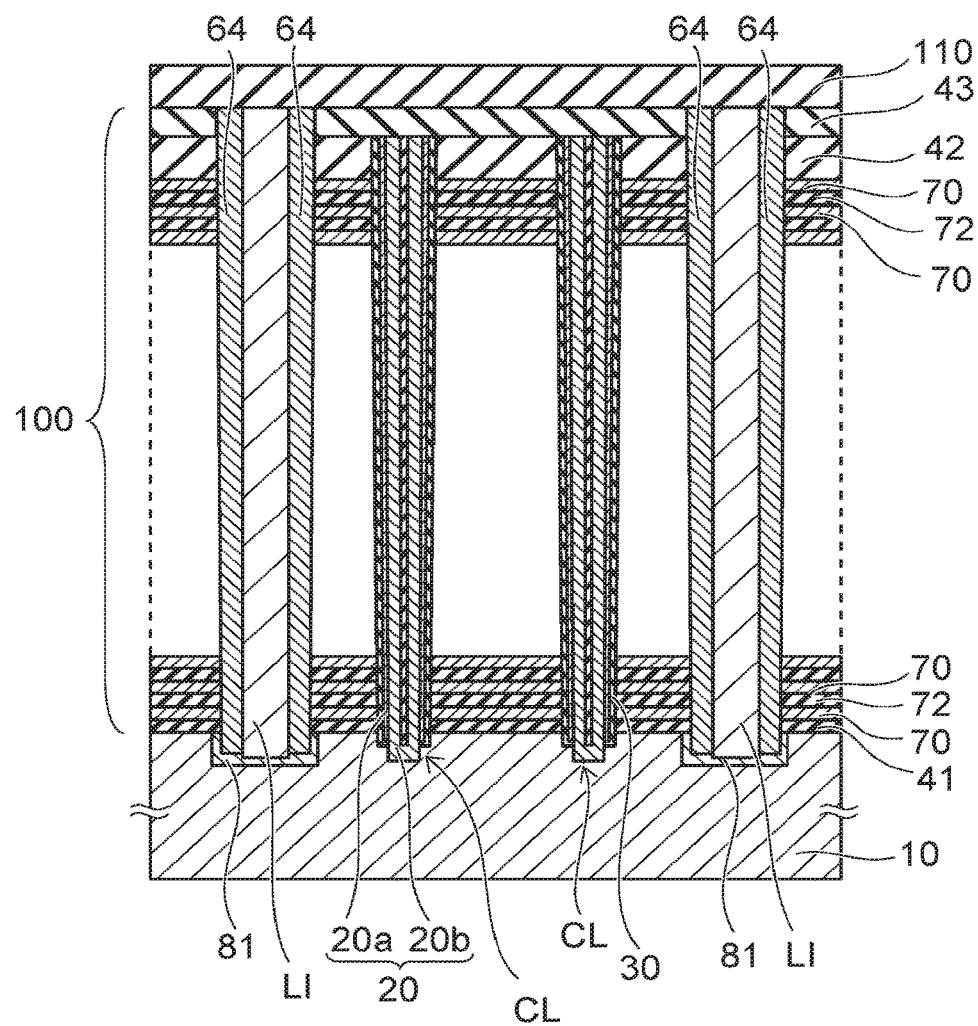

As shown in FIG. 22B, a cover film 110 is formed on an upper surface of the stacked body 100. FIG. 22A is a top view of FIG. 22B. The cover film 110 covers the upper ends of the conductive portions LI and upper ends of the sacrifice films 64. The upper ends of the conductive portions LI and the upper ends of the sacrifice films 64 are in contact with the cover film 110.

The cover film 110 is a metal oxide film, a silicon carbide film (SiC film), or a silicon carbonitride film (SiCN film). The metal oxide film used for the cover film 110 contains, for example, at least any of tantalum oxide (TaO), zirconium oxide (ZrO), and hafnium oxide (HfO).

Figure 23A:
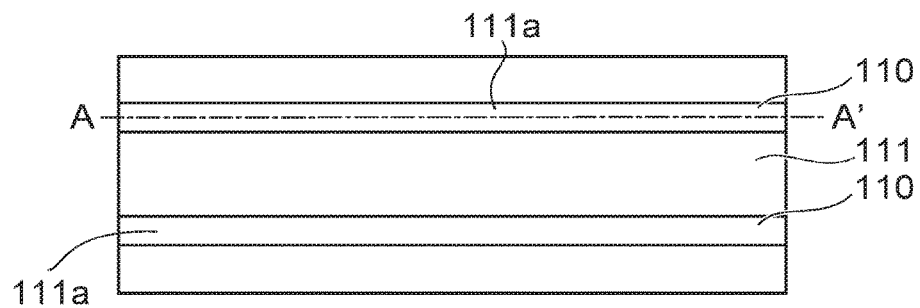

As shown in FIG. 23A, a resist film 111 is formed on the cover film 110. Slits 111a are selectively made in the resist film 111, and a portion of the cover film 110 is exposed at a bottom of the slit 111a.

Figure 23B:
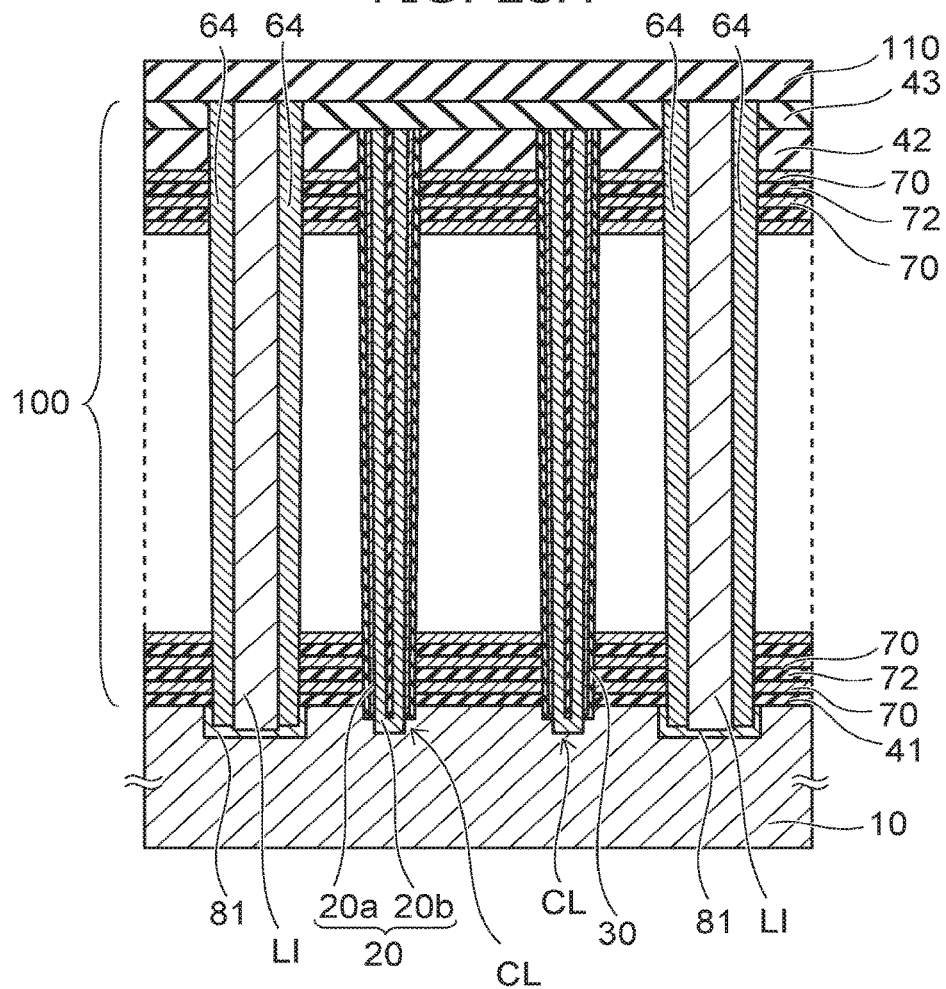

FIG. 23B is a sectional view taken along the line A-A' in FIG. 23A.

The slit 111a extends in a direction (the Y-direction in FIG. 2) crossing an extending direction (the X-direction in FIG. 2) of the conductive portion LI.

Figure 24A:
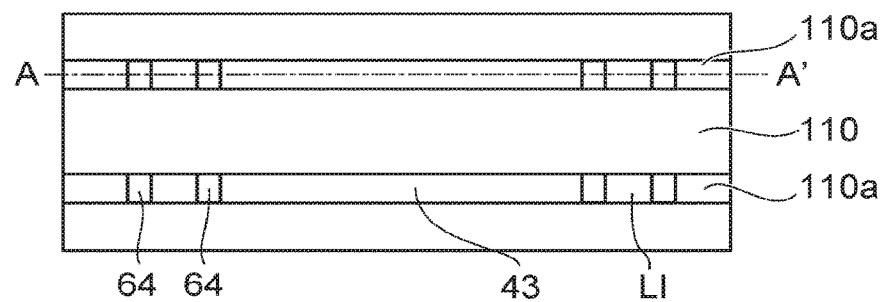

As shown in FIG. 24A, slits 110a are made in the cover film 110 by etching using the resist film 111 as a mask.

Figure 24B:
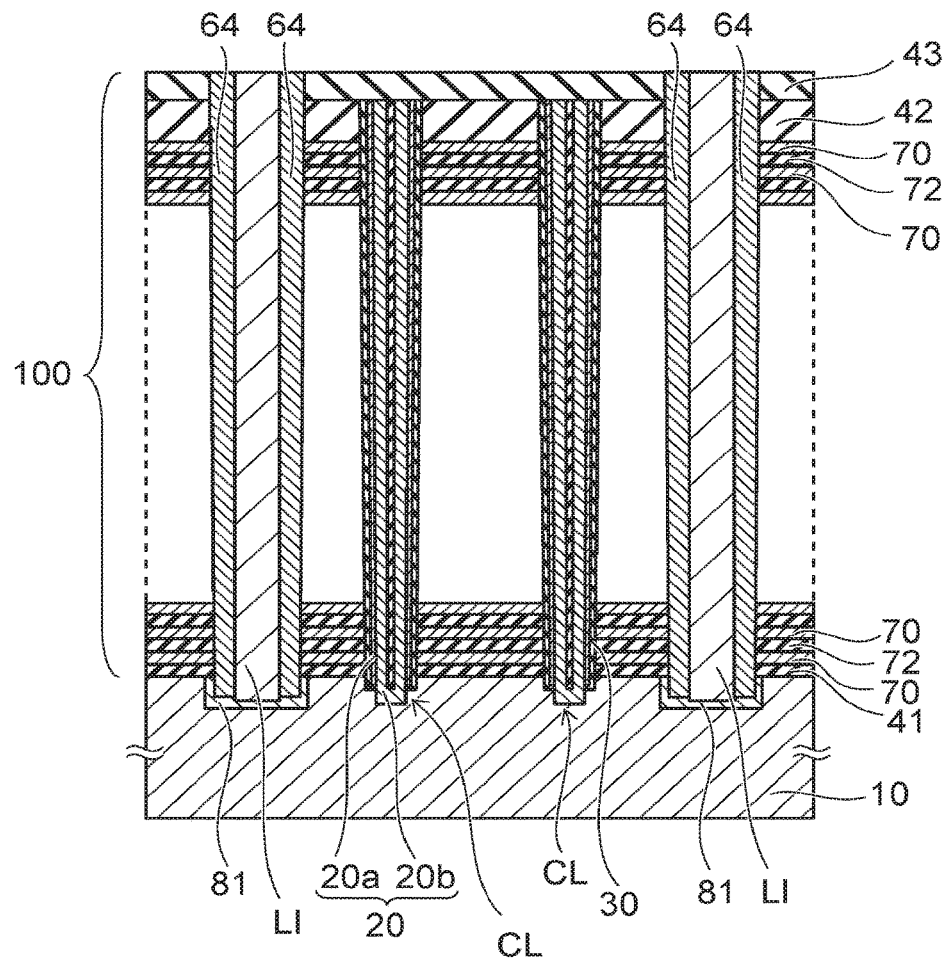

FIG. 24B is a sectional view taken along the line A-A' in FIG. 24A.

The slit 110a extends in the direction (the Y-direction in FIG. 2) crossing the extending direction (the X-direction in FIG. 2) of the conductive portion LI. The plurality of slits 110a is aligned separately from each other in the extending direction of the conductive portion LI. Portions of the conductive portions LI and portions of the sacrifice films 64 are exposed at a bottom of the slit 110a.

Then, the sacrifice films 64 are removed by etching. Etching with an etchant proceeds from the upper end of the sacrifice film 64 exposed in the slit 110a.

When the sacrifice film 64 is a silicon nitride film, the silicon nitride film can be removed with an etchant containing phosphoric acid. When the sacrifice film 64 is a silicon oxide film or a BSG film, the film can be removed with an etchant containing hydrofluoric acid.

The etching selectivity of the sacrifice film 64 with respect to the conductive portion LI, the electrode film 70, the insulating films 41, 42, and 43, the cover film 110, and the substrate 10 is sufficiently high. That is, the conductive portion LI, the electrode film 70, the insulating films 41, 42, and 43, the cover film 110, and the substrate 10 have high etching resistance to phosphoric acid and hydrofluoric acid, and are left without being etched.

Figure 25A:
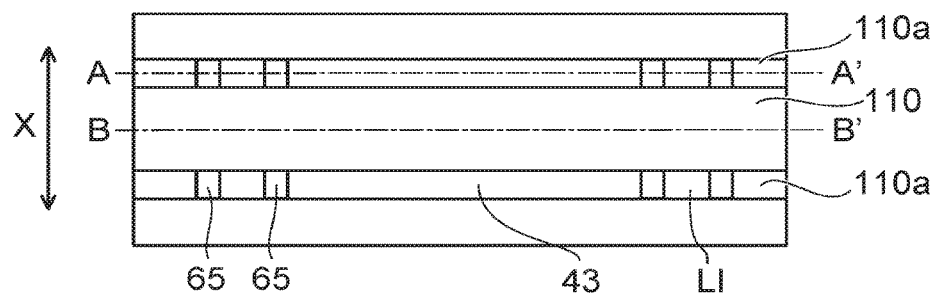
Figure 25B:
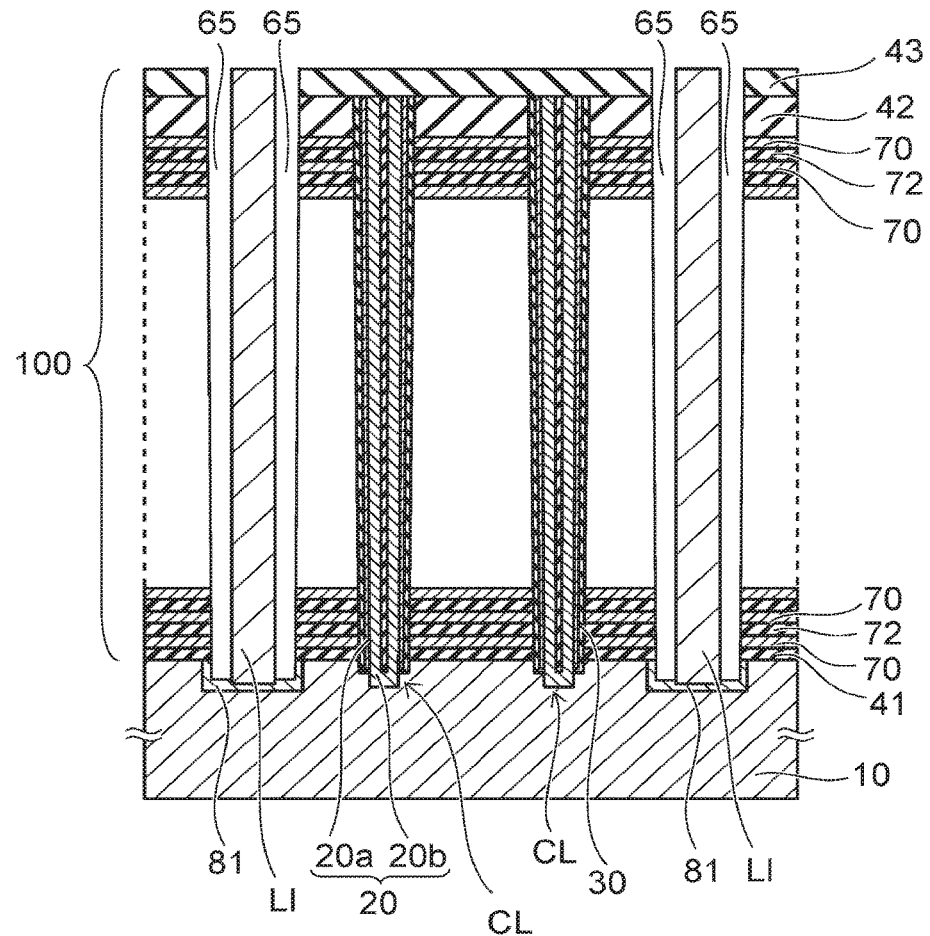

The sacrifice films 64 are removed, so that the slits 65 are made between the side surface of the conductive portion LI and the stacked body 100 as shown in FIG. 25B.

FIG. 25B is a sectional view taken along the line A-A' in FIG. 25A, showing a cross-section of the stacked body 100 below the slit 110a where the cover film 110 is absent.

Figure 26:
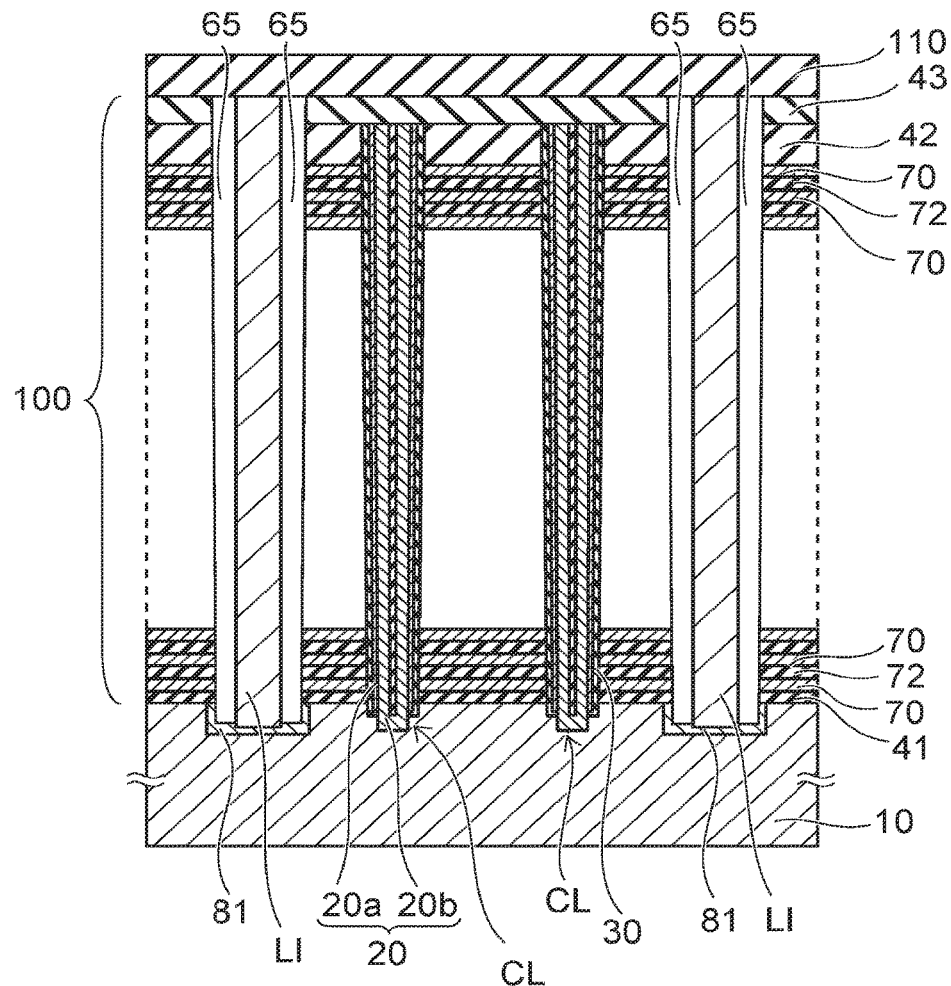

FIG. 26 is a sectional view taken along the line B-B' in FIG. 25A, showing a cross-section of the stacked body 100 in an area covered with the cover film 110.

Etching proceeds in the depth direction from a side of the upper end of the sacrifice film 64 exposed in the slit 110a in the cover film 110, and the erosion of the sacrifice film 64 due to an etchant also proceeds in the extending direction (the X-direction) of the conductive portion LI.

As shown in FIG. 25A and FIG. 26, a portion of the upper surface of the conductive portion LI is in contact with the cover film 110 that is selectively left. Although the conductive portion LI loses support from the stacked body 100 due to the formation of the slit 65, the upper end and the lower end of the conductive portion LI are supported by the cover film 110 and the substrate 10, respectively, and thus the conductive portion LI does not collapse.

When the sacrifice film 72 between the electrode films 70 is made of the same material as the sacrifice film 64 on the side surface of the conductive portion LI, the sacrifice film 72 can be successively removed in etching of the sacrifice film 64. In this case, there is a concern that the upper portion of the columnar portion CL is exposed to an etchant for a long time and thus etched. By changing the time for etching the sacrifice film 64, the sacrifice film 72 between the electrode films 70 can be left at least around the columnar portion CL.

The sacrifice film 72 between the electrode films 70 can be removed with an etchant supplied through the slit 65 after the slit 65 is made. By the removal of the sacrifice film 72, the gap 40 in communication with the slit 65 is made between the electrode films 70 vertically adjacent to each other as shown in FIG. 27B.

Figure 27A:
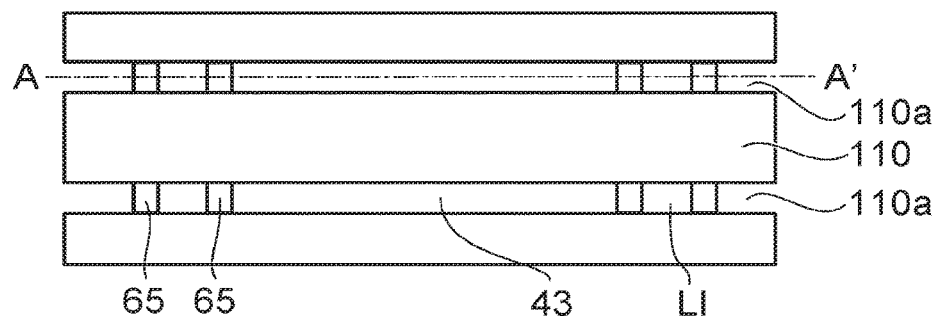
Figure 27B:
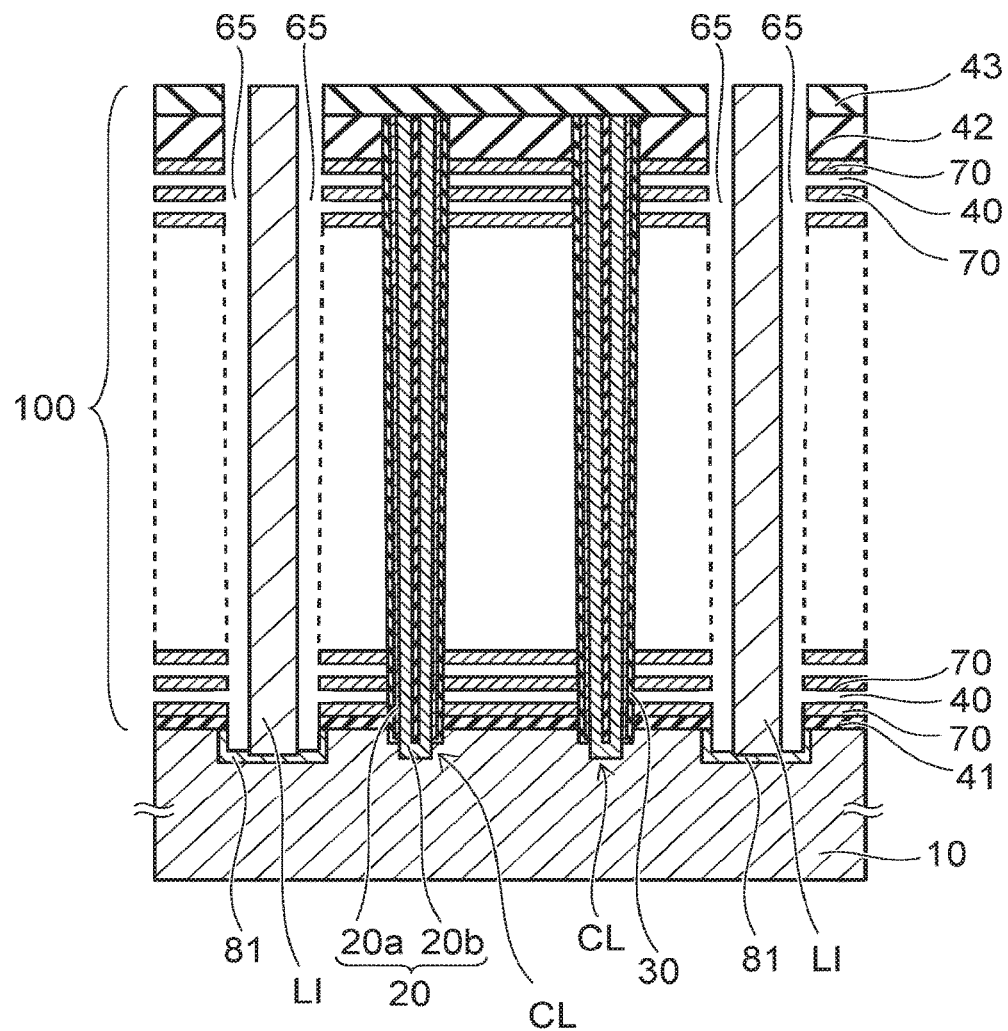

FIG. 27B is a sectional view taken along the line A-A' in FIG. 27A.

For example, the sacrifice film 72, which is a silicon oxide film, is removed with an etchant containing hydrofluoric acid. The cover film 110, the electrode film 70, the insulating films 41, 42, and 43, and the substrate 10 are left without being etched.

After the gap 40 is made, the insulating film 47 with low coverage is formed on the cover film 110 and on the insulating film 43 as shown in FIG. 20, and the upper end of the slit 65 is closed by a portion of the insulating film 47.

Figure 28:
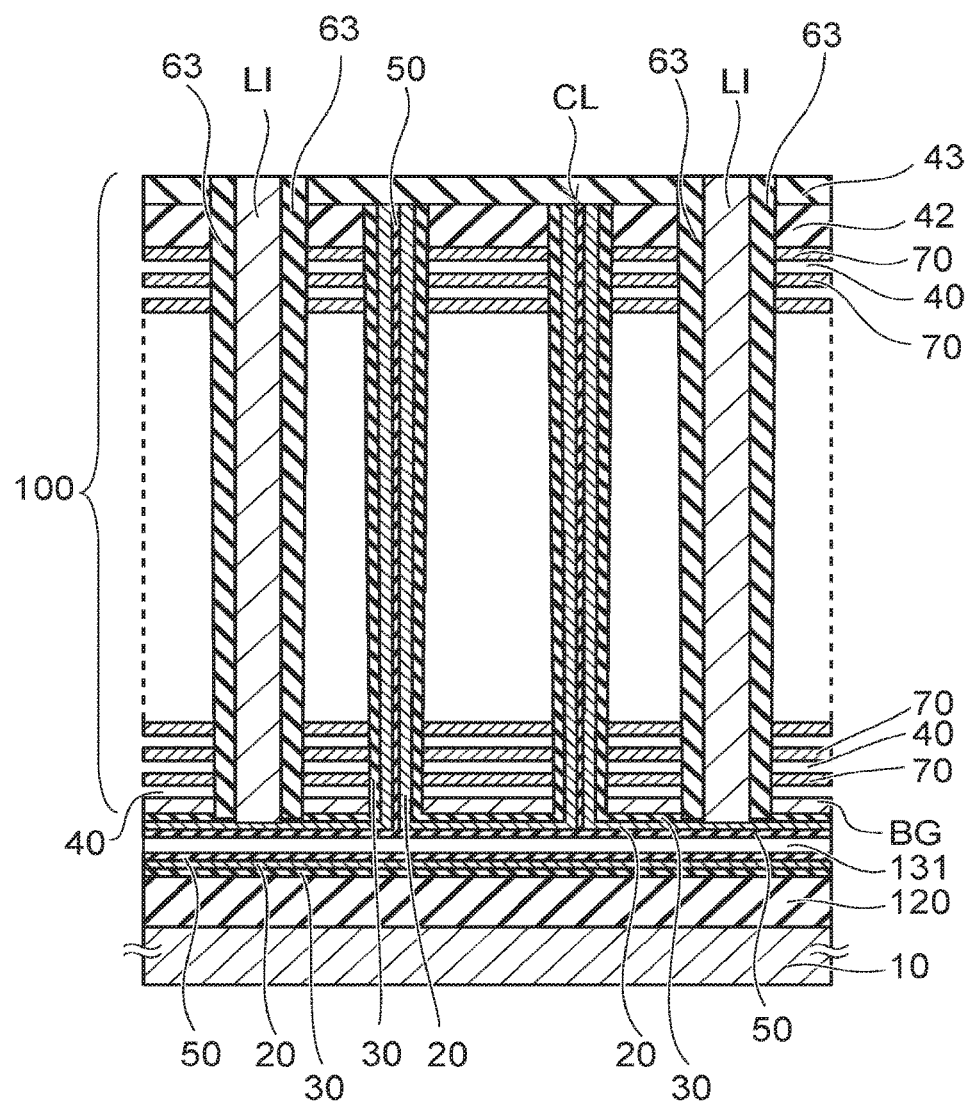
FIG. 28 is a schematic perspective view of the memory cell array of the semiconductor device of the embodiment.

Next, FIG. 28 is a schematic sectional view of a still another example of a memory cell array.

The memory cell array shown in FIG. 28 also includes, similarly to the embodiment described above, the substrate 10, the plurality of electrode films 70 stacked with the gaps 40 each interposed therebetween, the plurality of columnar portions CL, and the plurality of conductive portions LI.

A back gate BG is provided below the lowermost electrode film 70. The gap 40 is provided between the lowermost electrode film 70 and the back gate BG. The back gate BG is a conducting or semiconducting film, and is, for example, a silicon film containing silicon as a main component.

The same stacked film as the stacked film of the columnar portion CL is provided also below the back gate BG. The memory film 30 is provided under a lower surface of the back gate BG, the semiconductor film 20 is provided in contact with a lower surface of the memory film 30, and the core film 50 is provided in contact with a lower surface of the semiconductor film 20.

The memory film 30 of the columnar portion CL and the memory film 30 provided under the lower surface of the back gate BG are continuously provided integrally together. The semiconductor film 20 of the columnar portion CL and the semiconductor film 20 provided under the lower surface of the back gate BG are continuously provided integrally together. The core film 50 of the columnar portion CL and the core film 50 provided under the lower surface of the back gate BG are continuously provided integrally together.

An insulating layer 120 is provided on the substrate 10, and the same stacked film as the stacked film of the columnar portion CL is provided also on an upper surface of the insulating layer 120. The memory film 30 is provided on the upper surface of the insulating layer 120, the semiconductor film 20 is provided on the memory film 30, and the core film 50 is provided on the semiconductor film 20.

A cavity 131 is provided between the core film 50 on the insulating layer 120 and the core film 50 provided under the lower surface of the back gate BG.

The lower end of the conductive portion LI is in contact with the semiconductor film 20 provided under the lower surface of the back gate BG. Hence, the semiconductor film (a first semiconductor film) 20 of the columnar portion CL can be electrically connected with the conductive portion LI through the semiconductor film (a second semiconductor film) 20 provided under the lower surface of the back gate BG.

By controlling a potential applied to the back gate BG, a channel is induced in the semiconductor film (the second semiconductor film) 20 provided under the lower surface of the back gate BG, so that a current can be caused to flow between the semiconductor film (the first semiconductor film) 20 of the columnar portion CL and the conductive portion LI. The memory film 30 provided between the back gate BG and the second semiconductor film 20 and in contact with the back gate BG and the second semiconductor film 20 functions as a gate insulating film.

Next, with reference to FIG. 29 to FIG. 34, a method for forming the memory cell array shown in FIG. 28 will be described.

Figure 29:
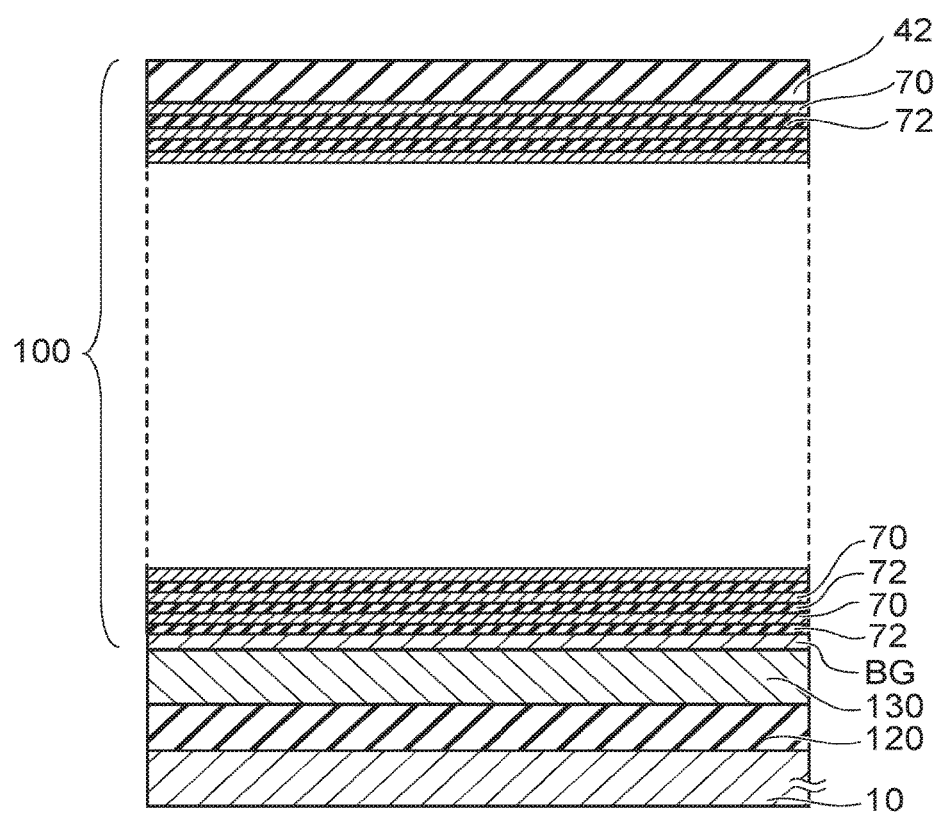
FIGS. 29 to 34 are schematic sectional views showing a method for manufacturing the semiconductor device of the embodiment.

As shown in FIG. 29, the insulating layer 120 is formed on the substrate 10, and a sacrifice layer 130 is formed on the insulating layer 120. For example, the insulating layer 120 is a silicon oxide film, and the sacrifice layer 130 is a silicon nitride film.

The back gate BG is formed on the sacrifice layer 130, and the sacrifice films 72 and the electrode films 70 are alternately stacked on the back gate BG. The back gate BG is, for example, a silicon film containing silicon as a main component.

The lowermost sacrifice film 72 is formed on an upper surface of the back gate BG. The process of alternately stacking the sacrifice film 72 and the electrode film 70 is repeated, so that the plurality of sacrifice films 72 and the plurality of electrode films 70 are formed on the substrate 10. For example, the sacrifice film 72 is a silicon oxide film, and the electrode film 70 is a tungsten film.

The insulating film 42 is formed on the uppermost electrode film 70. The uppermost electrode film 70 is formed between the uppermost sacrifice film 72 and the insulating film 42.

Similarly to the above-mentioned embodiment, the insulating film 42 is a metal oxide film, a silicon carbide film (SiC film), or a silicon carbonitride film (SiCN film).

Figure 30:
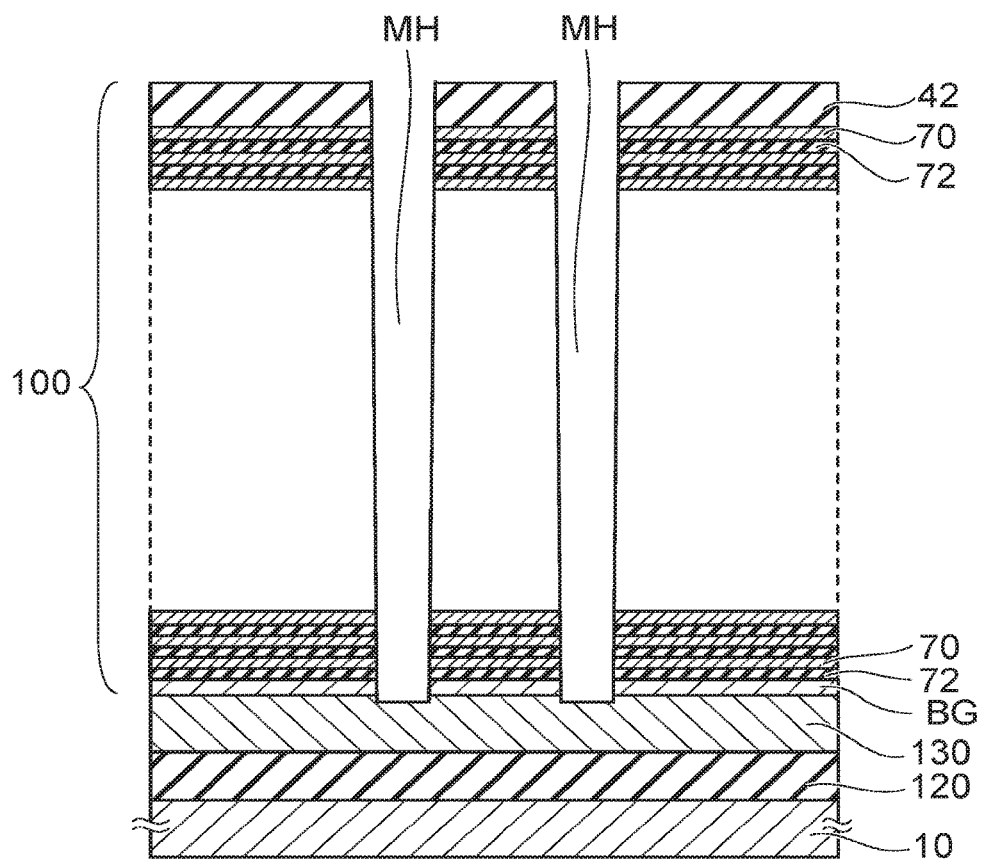

Next, as shown in FIG. 30, the plurality of memory holes MH is made in the stacked body 100 including the back gate BG, the plurality of sacrifice films 72, the plurality of electrode films 70, and the insulating film 42. The memory hole MH is made by a RIE method using a mask (not shown). The memory hole MH pierces the stacked body 100 to reach the sacrifice layer 130.

Figure 31:
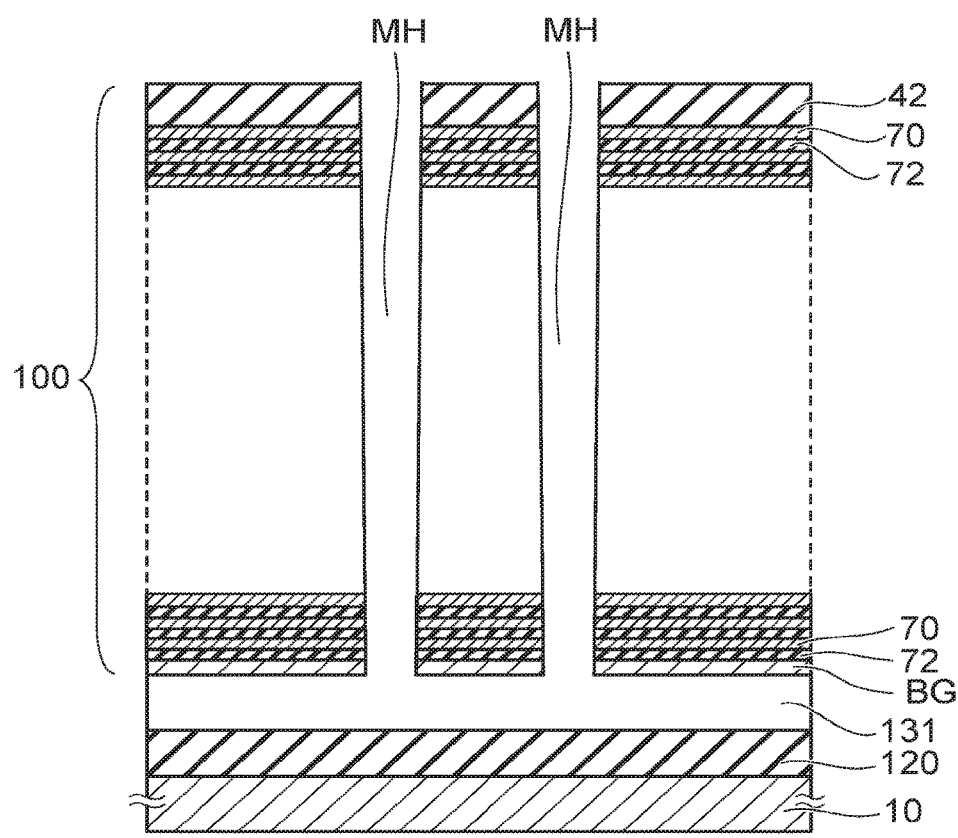

Next, the sacrifice layer 130 is removed with an etchant or etching gas supplied through the memory holes MH. With the removal of the sacrifice layer 130, the cavity 131 is made between the back gate BG and the insulating layer 120 as shown in FIG. 31.

For example, the sacrifice layer 130, which is a silicon nitride film, can be removed with an etchant containing phosphoric acid.

The etching selectivity of the sacrifice layer 130 with respect to the insulating layer 120, the back gate BG, the electrode film 70, the sacrifice film 72, and the insulating film 42 is sufficiently high. That is, the insulating layer 120, the back gate BG, the electrode film 70, the sacrifice film 72, and the insulating film 42 have high etching resistance to phosphoric acid, and are left without being etched.

Figure 32:
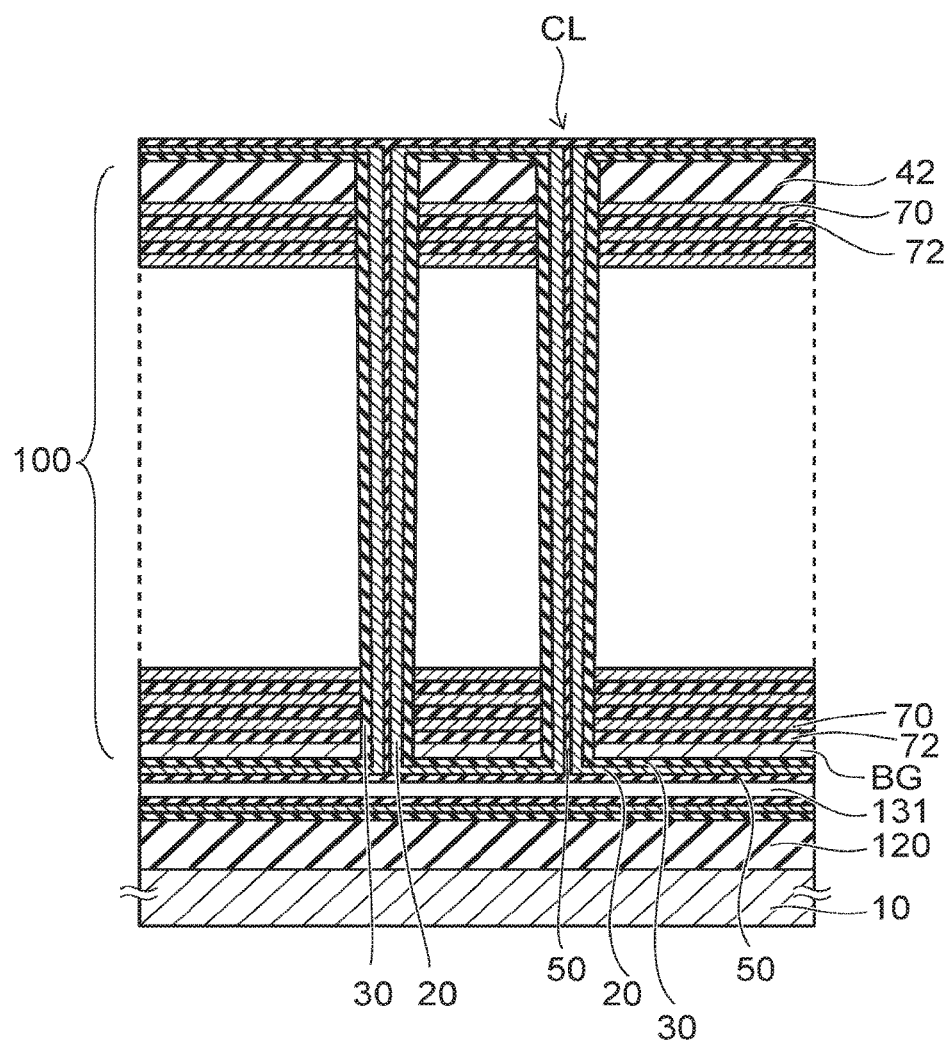

As shown in FIG. 32, the stacked film included in the columnar portion CL is formed on a side surface of the memory hole MH and an upper surface and a lower surface of the cavity 131. The upper surface of the cavity 131 is the lower surface of the back gate BG. The lower surface of the cavity 131 is the upper surface of the insulating layer 120.

First, the memory film 30 is continuously formed integrally on the side surface of the memory hole MH and under the lower surface of the back gate BG. At this time, the memory film 30 is also deposited on the upper surface of the insulating layer 120. The semiconductor film 20 and the core film 50 are successively formed inside the memory film 30.

The cavity 131 is left between the stacked film provided under the lower surface of the back gate BG and the stacked film provided on the upper surface of the insulating layer 120. Alternatively, the cavity 131 may be filled with the stacked film.

Figure 33:
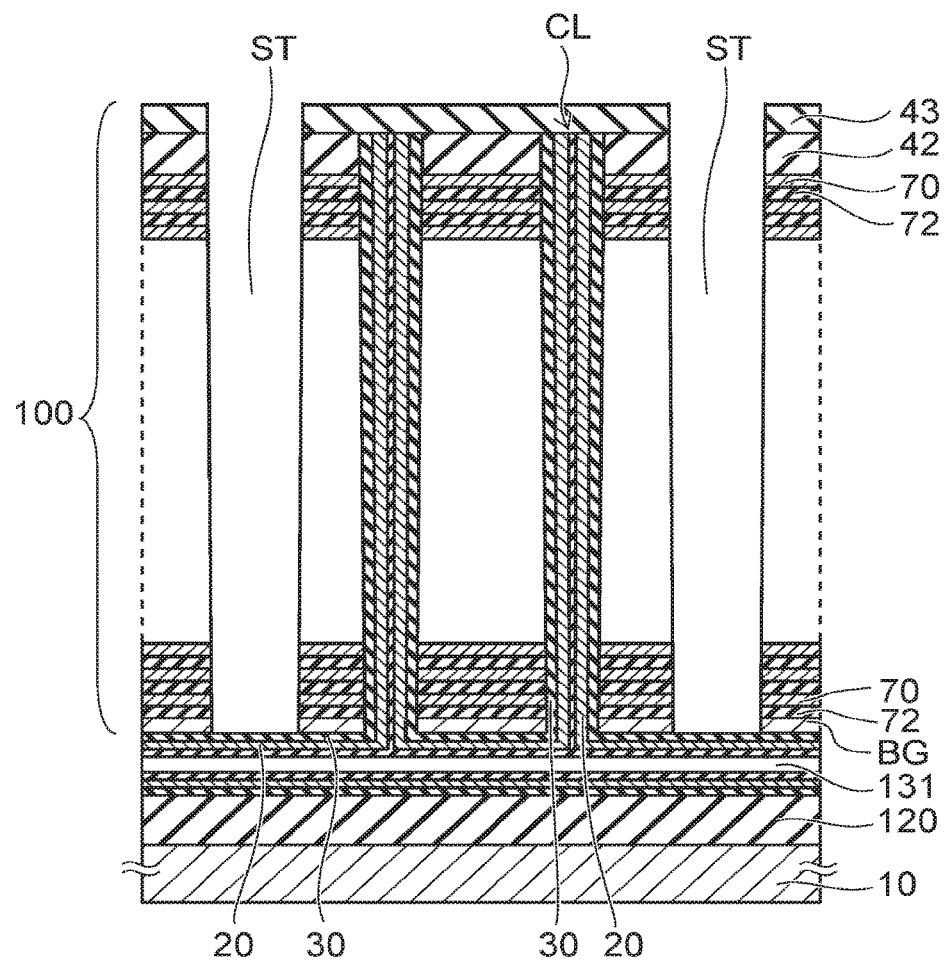

The films deposited on the insulating film 42 shown in FIG. 32 are removed by CMP or etch-back. Thereafter, as shown in FIG. 33, the insulating film 43 is formed on the insulating film 42. The insulating film 43 covers upper ends of the stacked films being included in the columnar portions CL.

Similarly to the above mentioned embodiment, the insulating film 43 is a metal oxide film, a silicon carbide film (SiC film), or a silicon carbonitride film (SiCN film).

Then, the plurality of slits ST is made by a RIE method using a mask (not shown) in the stacked body 100 including the insulating films 43 and 42, the electrode film 70, the sacrifice film 72, and the back gate BG. The slit ST pierces the stacked body 100 to reach the memory film 30 provided on the lower surface of the back gate BG.

Figure 34:
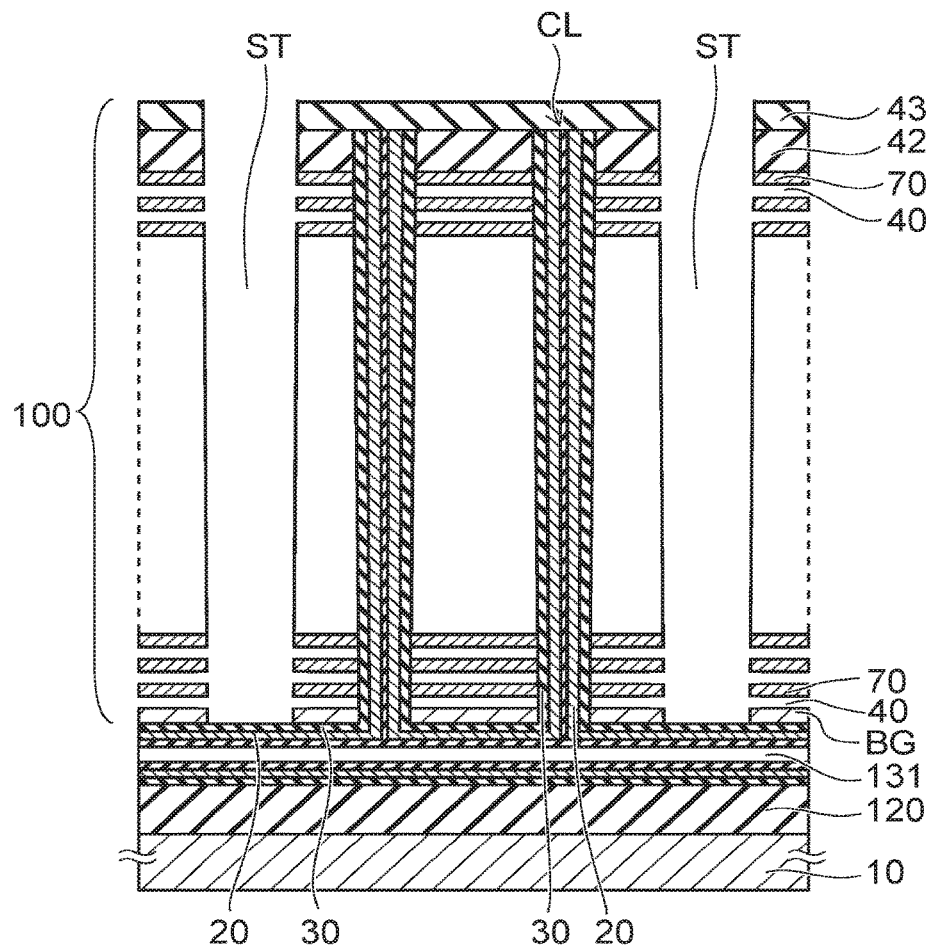

The sacrifice films 72 are removed with an etchant supplied through the slits ST. By the removal of the sacrifice film 72, the gap 40 is made between the electrode films 70 vertically adjacent to each other as shown in FIG. 34.

For example, the sacrifice film 72, which is a silicon oxide film, is removed with an etchant containing hydrofluoric acid.

The etching selectivity of the sacrifice film 72 with respect to the electrode film 70, the insulating films 42 and 43, and the back gate BG is sufficiently high. That is, the electrode film 70, the insulating films 42 and 43, and the back gate BG have high etching resistance to hydrofluoric acid, and are left without being etched.

Moreover, because the block film 35 provided at the outermost circumference of the columnar portion CL is a metal oxide film, etching of the side surface of the columnar portion CL due to hydrofluoric acid entering through the gap 40 is suppressed. Similarly, because the uppermost surface of the memory film 30 on the bottom of the slit ST is the block film 35 (metal oxide film), etching of the memory film 30 on the bottom of the slit ST due to hydrofluoric acid is suppressed.

The plurality of electrode films 70 stacked with the gaps 40 therebetween is supported by the columnar portion CL.

After the gaps 40 are made, the insulating film 63 shown in FIG. 28 is formed on the side surface and the bottom of the slit ST. The insulating film 63 with low coverage closes openings of the gaps 40 on the slit ST side. The gaps 40 are not filled with the insulating film 63.

The insulating film 63 and the memory film 30 deposited on the bottom of the slit ST are removed by a RIE method to expose the semiconductor film 20 at the bottom of the slit ST. Then, the conductive portion LI is buried in the slit ST. The lower end of the conductive portion LI is in contact with the semiconductor film 20 below the back gate BG.

Figure 35:
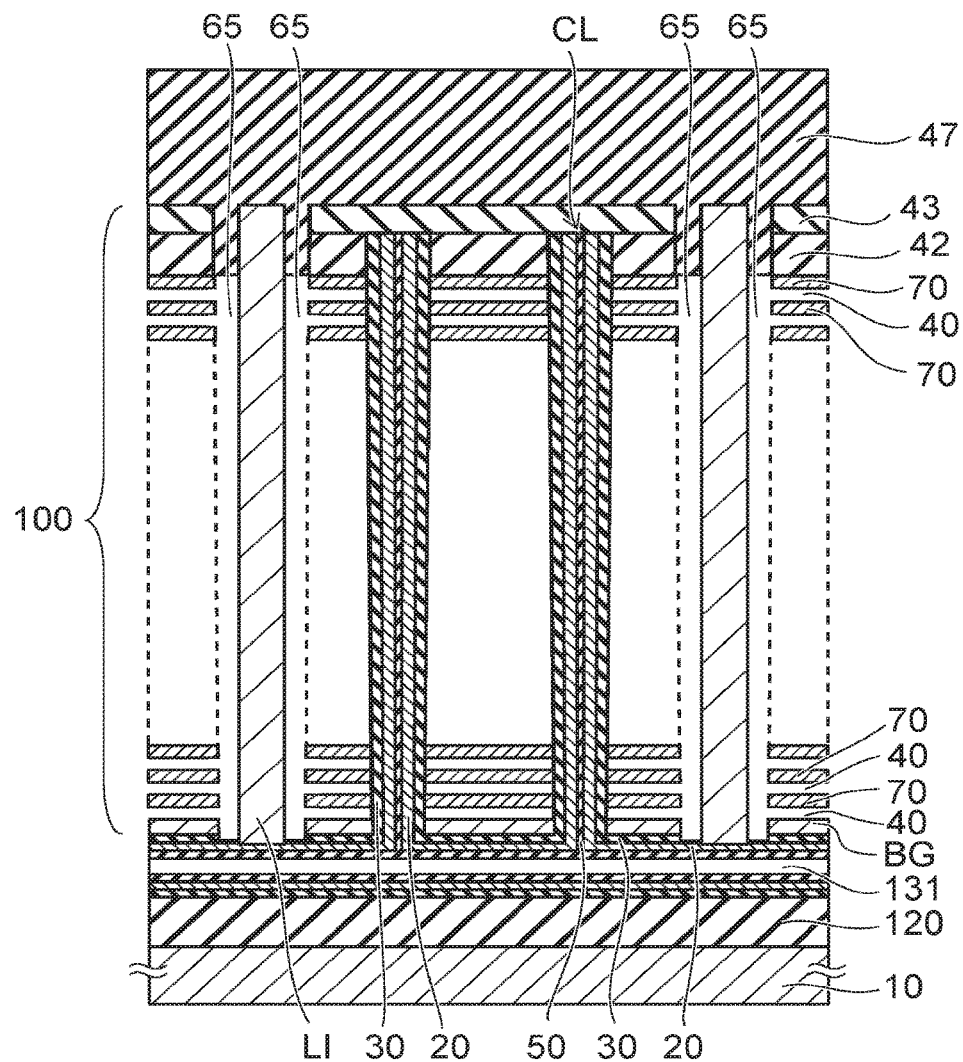
FIG. 35 is a schematic perspective view of a memory cell array of the semiconductor device of the embodiment.

FIG. 35 is a schematic sectional view showing yet still another example of a memory cell array of the embodiment.

In the memory cell array shown in FIG. 35, gaps are each provided also between the side surface of the conductive portion LI and the stacked body 100. The slits 65 extending in the stacking direction and in a depth direction of this paper (the X-direction in FIG. 2) are each formed between the side surface of the conductive portion LI and the stacked body 100. The slit 65 is in communication with the gaps 40.

The insulating film 47 is provided on the insulating film 43, and a portion of the insulating film 47 closes the upper end of the slit 65. By forming, for example, a silicon oxide film with low coverage as the insulating film 47, the slits 65 are prevented from being filled with the insulating film 47.

The edge portions of the electrode films 70 vertically adjacent to each other on the conductive portion LI side are not connected to each other through the surface of the insulating film. Therefore, it is possible to prevent a short circuit between the electrode films 70 due to migration occurring on the surface of the insulating film.

The other elements are the same as those of the above-described memory cell array shown in FIG. 28, and the detailed description thereof is omitted.

Next, with reference to FIG. 36A to FIG. 40B, a method for forming the memory cell array shown in FIG. 35 will be described.

The processes shown in FIG. 29 to FIG. 33 are carried out similarly to the embodiment described above. After the process in FIG. 33, the sacrifice film 64 shown in FIG. 36B is formed on the side surface and the bottom of the slit ST.

The sacrifice film 64 and the memory film 30 deposited on the bottom of the slit ST are removed by a RIE method to expose the semiconductor film 20 at the bottom of the slit ST. Then, the conductive portion LI is buried in the slit ST. The lower end of the conductive portion LI is in contact with the semiconductor film 20 below the back gate BG. The sacrifice film 64 is formed on the side surface of the conductive portion LI.

The sacrifice film 64 is, for example, a BSG (Boron-Silicate Glass) film or a silicon nitride film. Alternatively, the sacrifice film 64 is a stacked film of a silicon oxide film formed on the side surface of the conductive portion LI and a silicon nitride film formed on a side surface of the silicon oxide film.

Figure 36A:
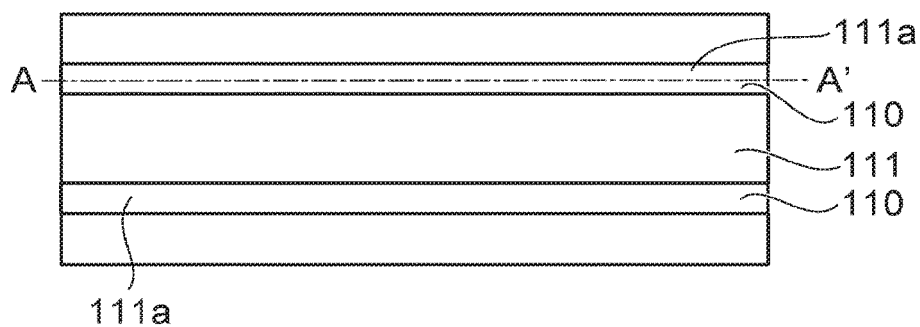
FIGS. 36A to 44 are schematic sectional views showing a method for manufacturing the semiconductor device of the embodiment.
Figure 36B:
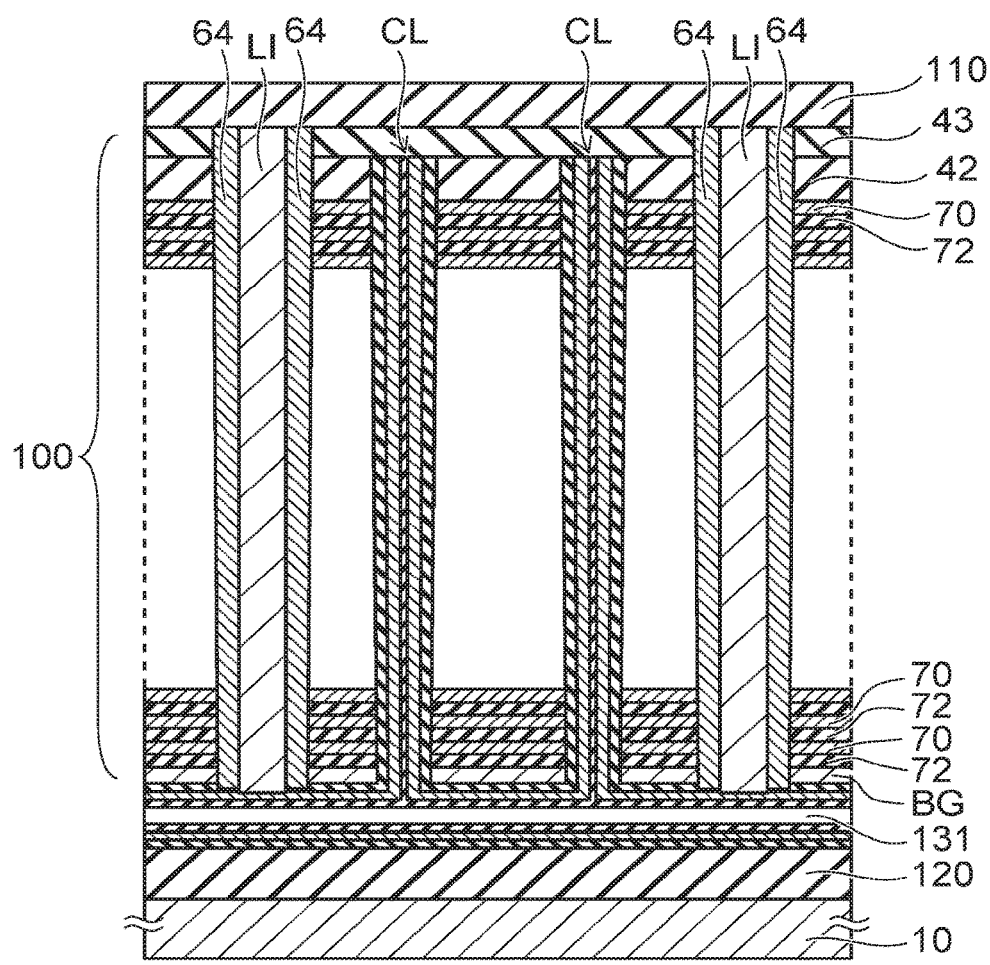

As shown in FIG. 36B, the cover film 110 is formed on the upper surface of the stacked body 100. The cover film 110 covers the upper ends of the conductive portions LI and the upper ends of the sacrifice films 64. The upper ends of the conductive portions LI and the upper ends of the sacrifice films 64 are in contact with the cover film 110.

The cover film 110 is a metal oxide film, a silicon carbide film (SiC film), or a silicon carbonitride film (SiCN film). The metal oxide film used for the cover film 110 contains, for example, at least any of tantalum oxide (TaO), zirconium oxide (ZrO), and hafnium oxide (HfO).

As shown in FIG. 36A, the resist film 111 is formed on the cover film 110. The slits 111a are selectively formed in the resist film 111, and a portion of the cover film 110 is exposed at the bottom of the slit 111a.

FIG. 36B is a sectional view taken along the line A-A' in FIG. 36A.

The slit 111a extends in the direction (the Y-direction in FIG. 2) crossing the extending direction (the X-direction in FIG. 2) of the conductive portion LI.

Figure 37A:
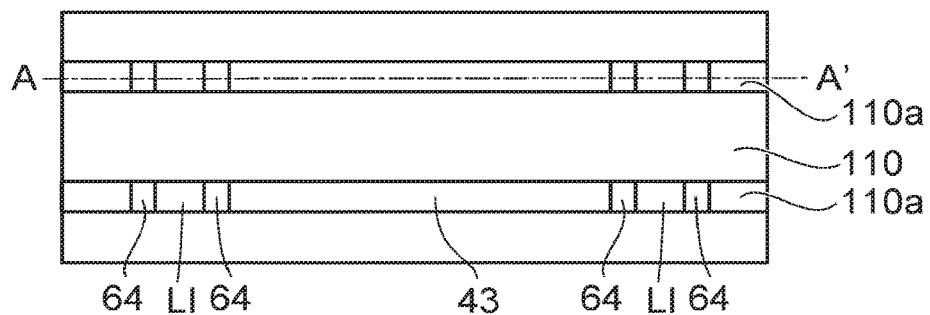

As shown in FIG. 37A, the slits 110a are formed in the cover film 110 by etching using the resist film 111 as a mask.

Figure 37B:
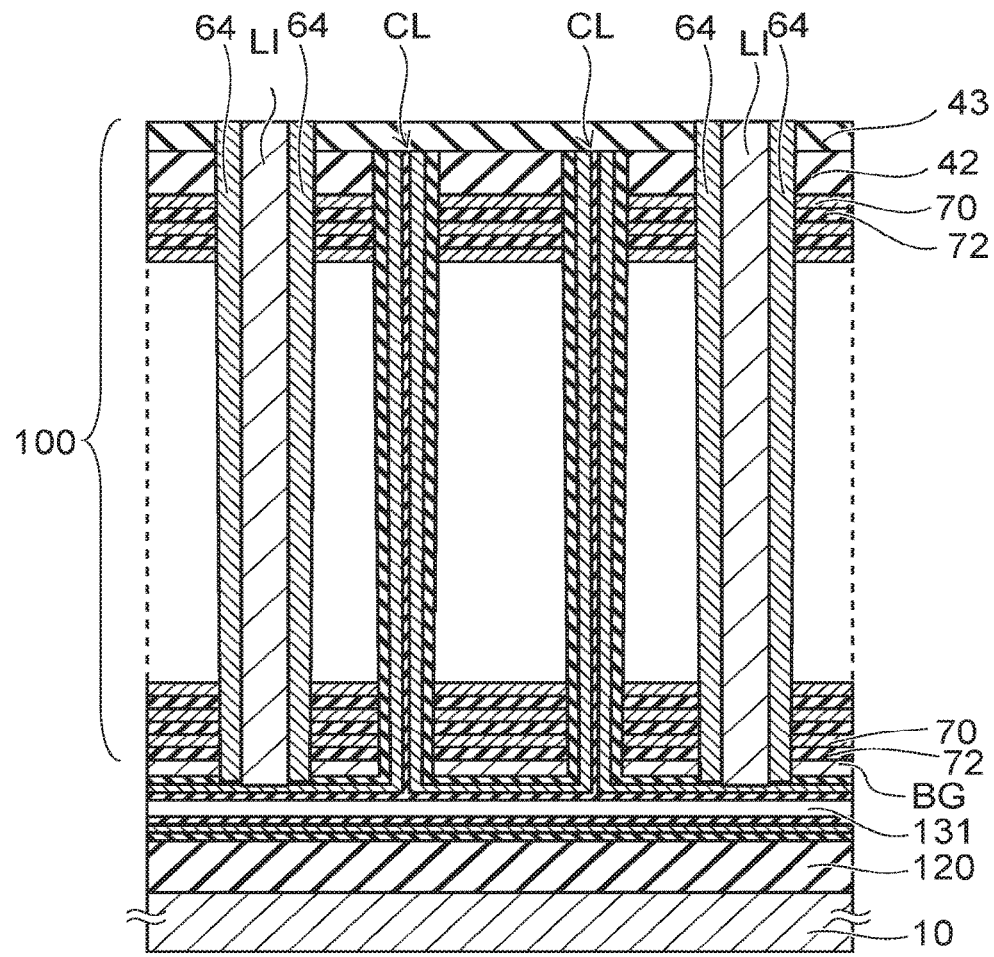

FIG. 37B is a sectional view taken along the line A-A' in FIG. 37A.

The slit 110a extends in the direction (the Y-direction in FIG. 2) crossing the extending direction (the X-direction in FIG. 2) of the conductive portion LI. The plurality of slits 110a is aligned separately from each other in the extending direction of the conductive portion LI. Portions of the conductive portions LI and portions of the sacrifice films 64 are exposed at the bottom of the slit 110a.

Then, the sacrifice films 64 are removed by etching. Etching with an etchant proceeds from the upper end of the sacrifice film 64 exposed in the slit 110a.

When the sacrifice film 64 is a silicon nitride film, the silicon nitride film can be removed with an etchant containing phosphoric acid. When the sacrifice film 64 is a silicon oxide film or a BSG film, the film can be removed with an etchant containing hydrofluoric acid.

The etching selectivity of the sacrifice film 64 with respect to the conductive portion LI, the electrode film 70, the insulating films 42 and 43, the cover film 110, the back gate BG, and the semiconductor film 20 on the bottom of the slit ST is sufficiently high. That is, the conductive portion LI, the electrode film 70, the insulating films 42 and 43, the cover film 110, the back gate BG, and the semiconductor film 20 on the bottom of the slit ST have high etching resistance to phosphoric acid and hydrofluoric acid, and are left without being etched.

Figure 38A:
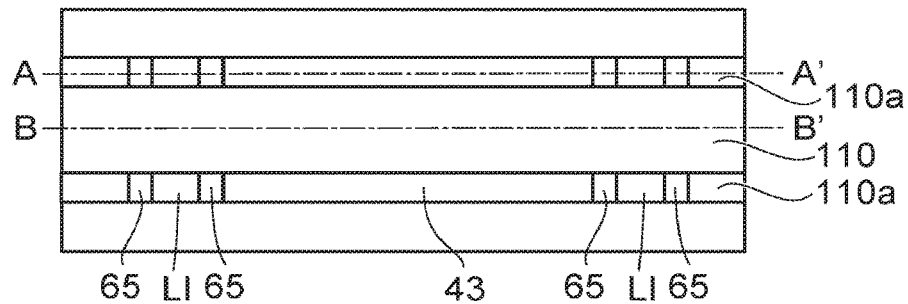
Figure 38B:
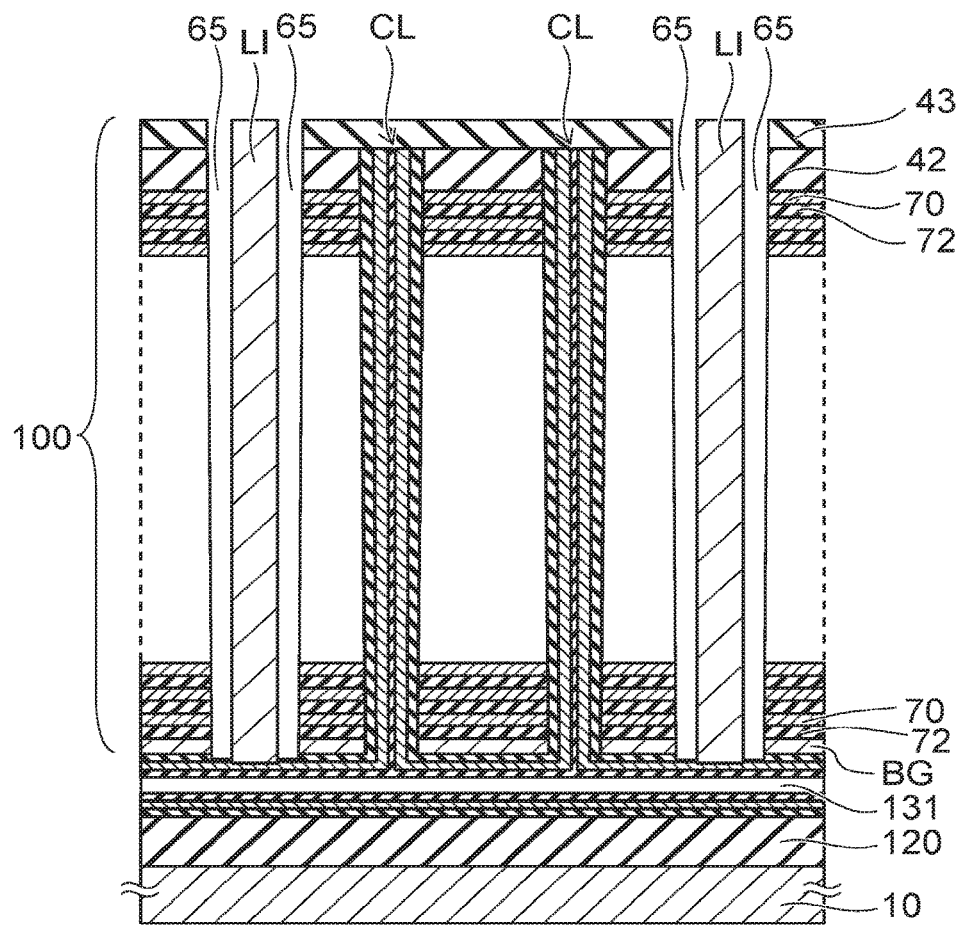

The sacrifice films 64 are removed, so that the slits 65 are each made between the side surface of the conductive portion LI and the stacked body 100 as shown in FIG. 38B.

FIG. 38B is a sectional view taken along the line A-A' in FIG. 38A, showing a cross-section of the stacked body 100 below the slit 110a where the cover film 110 is absent.

Figure 39:
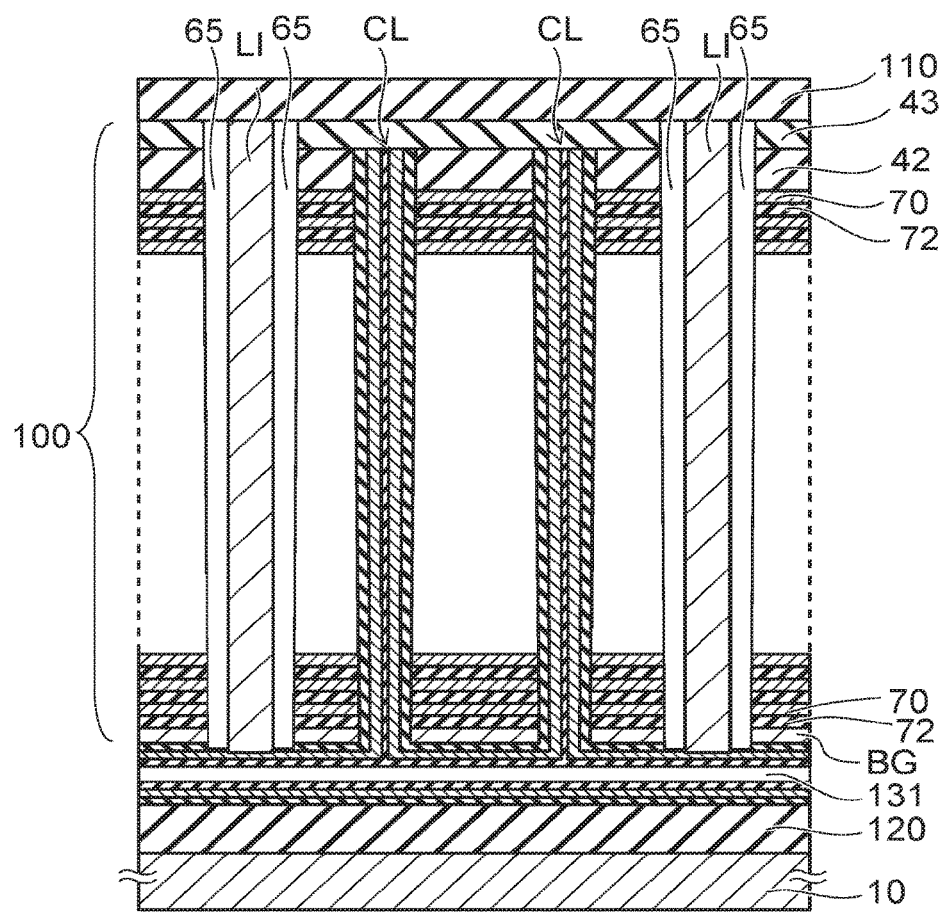

FIG. 39 is a sectional view taken along the line B-B' in FIG. 38A, showing a cross-section of the stacked body 100 in the area covered with the cover film 110.

Etching proceeds in the depth direction from the side of the upper end of the sacrifice film 64 exposed in the slit 110a in the cover film 110, and at the same time, the erosion of the sacrifice film 64 due to an etchant proceeds also in the extending direction (the X-direction) of the conductive portion LI.

As shown in FIG. 38A and FIG. 39, a portion of the upper surface of the conductive portion LI is in contact with the cover film 110 that is selectively left. Although the conductive portion LI loses support from the stacked body 100 due to making the slit 65, the upper end and the lower end of the conductive portion LI are supported by the cover film 110 and the stacked film below the back gate BG, respectively, and thus the conductive portion LI does not collapse.

When the sacrifice film 72 between the electrode films 70 is made of the same material as the sacrifice film 64 on the side surface of the conductive portion LI, the sacrifice film 72 can be successively removed in etching of the sacrifice film 64. In this case, there is a concern that the upper portion of the columnar portion CL is exposed to an etchant for a long time and thus etched. By changing the time for etching the sacrifice film 64, the sacrifice film 72 between the electrode films 70 can be left at least around the columnar portion CL.

The sacrifice film 72 between the electrode films 70 can be removed with an etchant supplied through the slit 65 after the slit 65 is formed. With the removal of the sacrifice film 72, the gap 40 in communication with the slit 65 is formed between the electrode films 70 vertically adjacent to each other as shown in FIG. 40B.

Figure 40A:
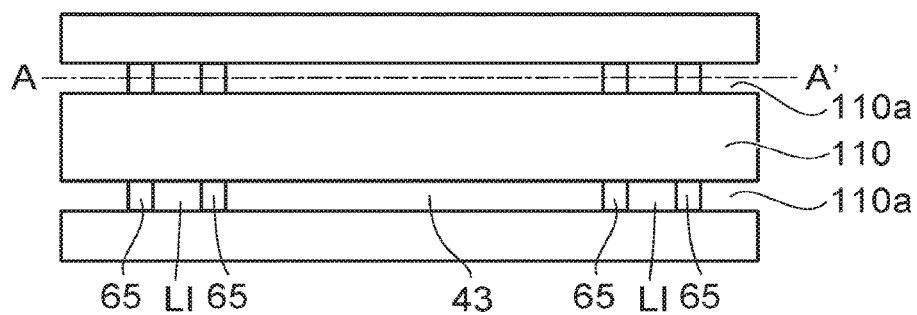
Figure 40B:
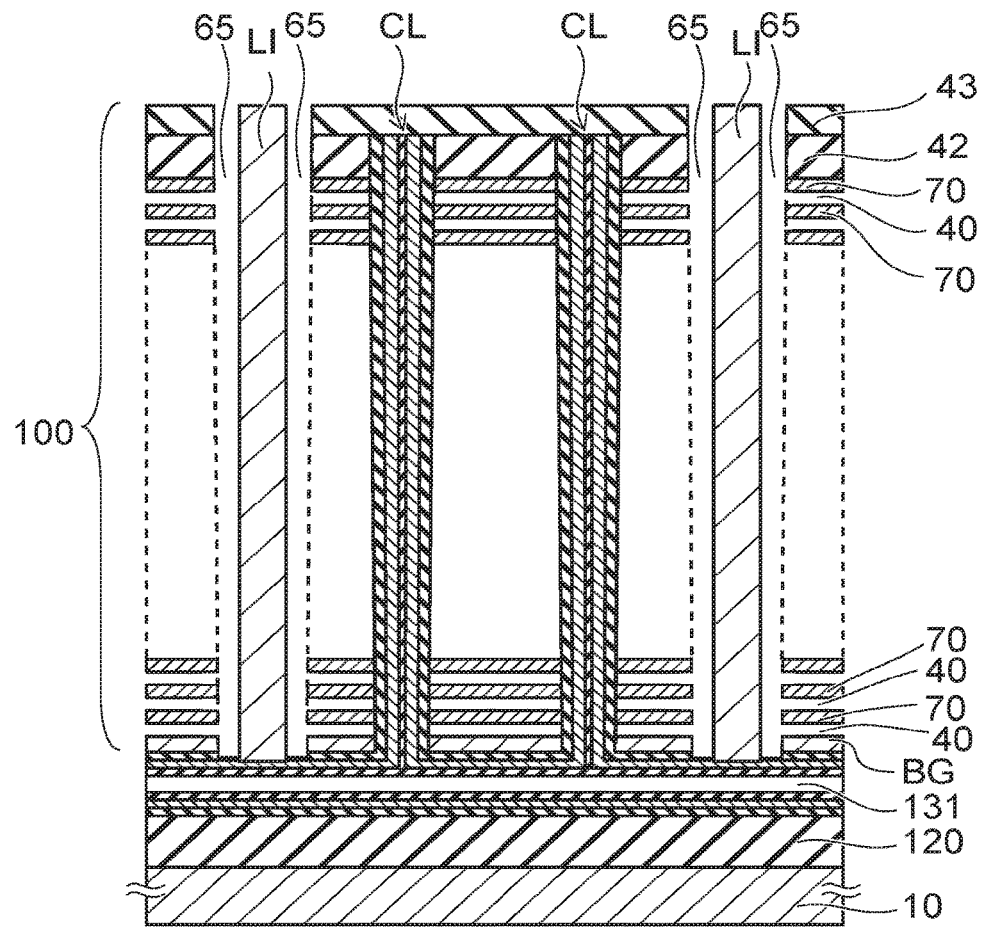

FIG. 40B is a sectional view taken along the line A-A' in FIG. 40A.

For example, the sacrifice film 72, which is a silicon oxide film, is removed with an etchant containing hydrofluoric acid. The cover film 110, the electrode film 70, the insulating films 42 and 43, the back gate BG, and the semiconductor film 20 on the bottom of the slit 65 are z without being etched.

After the gaps 40 are made, the insulating film 47 with low coverage is formed on the cover film 110 and on the insulating film 43 as shown in FIG. 35, and the upper end of the slit 65 is closed by a portion of the insulating film 47.

Next, with reference to FIG. 41A to FIG. 44, another example of a method for making the gap 40 between the electrode films 70 will be described.

A process shown in FIG. 41A to FIG. 44 can be applied to the process of using the first sacrifice film 71 and the second sacrifice film 72 in the embodiment described above.

Figure 41A:
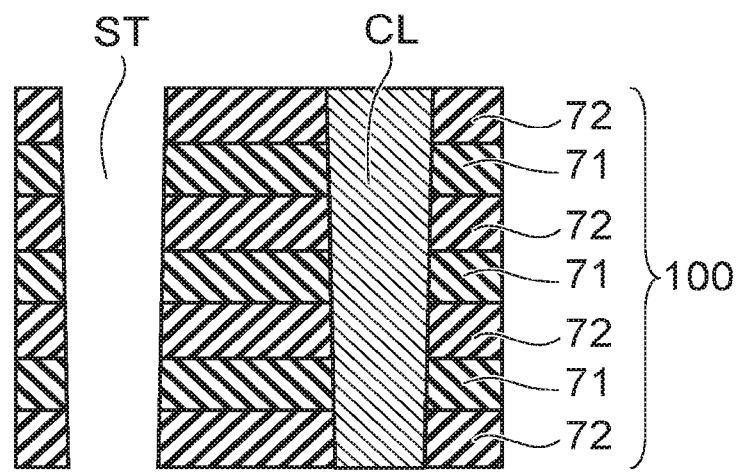

As shown in FIG. 41A, after the columnar portion CL is formed in the stacked body 100 including the plurality of first sacrifice films 71 and the plurality of second sacrifice films 72, the slit ST is made in the stacked body 100.

Figure 41B:
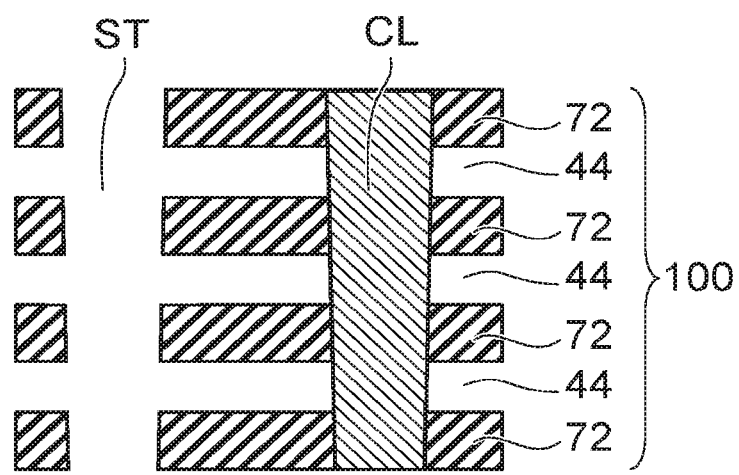

Then, the first sacrifice films 71 are removed by etching through the slit ST, and as shown in FIG. 41B, the gap 44 is made between the plurality of second sacrifice films 72.

For example, the first sacrifice film 71, which is a silicon nitride film, is removed using an etchant containing phosphoric acid.

Figure 42A:
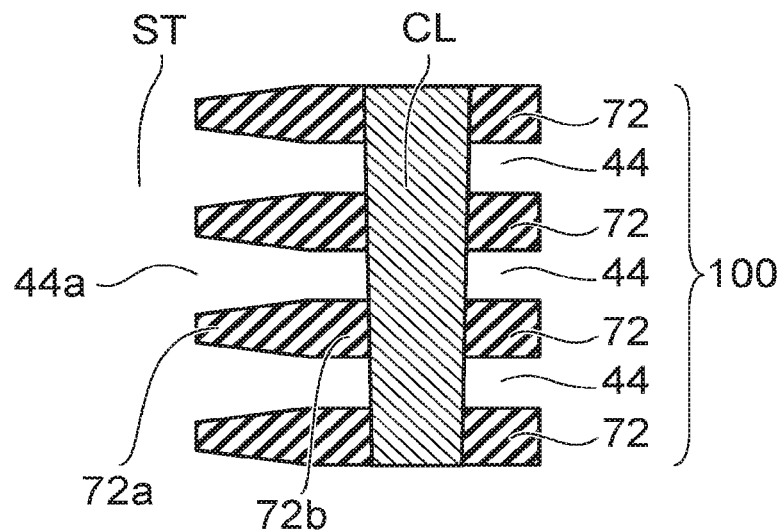

After the first sacrifice films 71 are removed as shown in FIG. 42A, the height of an open edge 44a on the slit ST side in the gap 44 is increased. An upper surface and a lower surface of an edge portion 72a on the slit ST side in the left second sacrifice film 72 are selectively etched, so that the thickness of the edge portion 72a of the second sacrifice film 72 is made thinner than the thickness of a portion 72b of the second sacrifice film 72 adjacent to the outer circumference of the columnar portion CL.

Since an etchant is supplied through the slit ST, etching can proceed further at the edge portion 72a on the slit ST side than at the portion 72b distant from the slit ST by properly controlling an etching time.

Figure 42B:
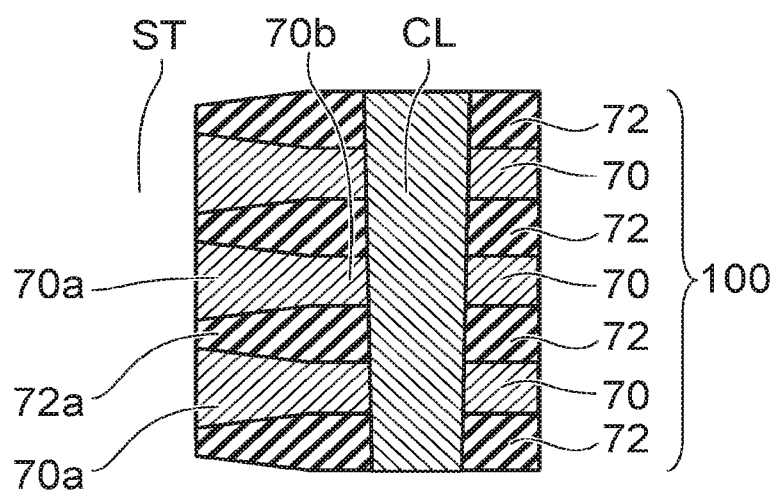

Thereafter, as shown in FIG. 42B, the electrode film 70 is formed in the gap 44. The thickness of an edge portion 70a on the slit ST side in the electrode film 70 becomes thicker than the thickness of a portion 70b of the electrode film 70 adjacent to the outer circumference of the columnar portion CL. The thickness herein represents a thickness in the stacking direction of the stacked body 100.

Figure 43A:
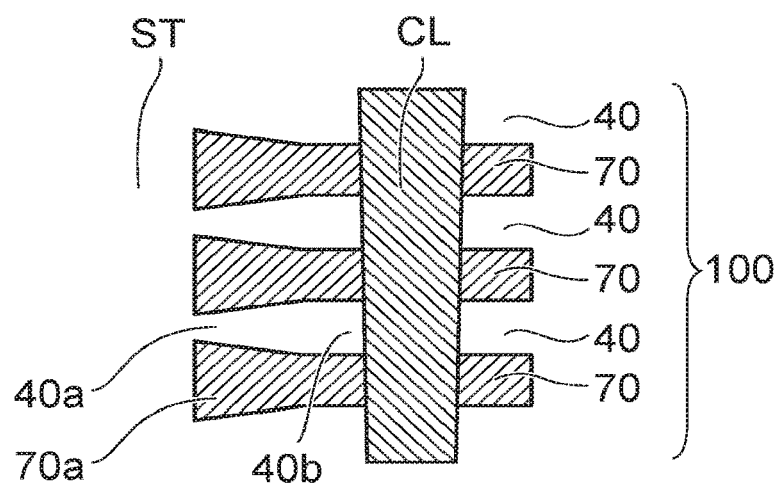

Next, the second sacrifice films 72 are removed by etching through the slit ST, and as shown in FIG. 43A, the gap 40 is made between the plurality of electrode films 70.

For example, the second sacrifice film 72, which is a silicon oxide film, is removed using an etchant containing hydrofluoric acid.

The height (distance between the electrode films 70) of an edge portion 40a of the gap 40 on the slit ST side is narrower than the height (distance between the electrode films 70) of a portion 40b of the gap 40 adjacent to the outer circumference of the columnar portion CL.

Figure 43B:
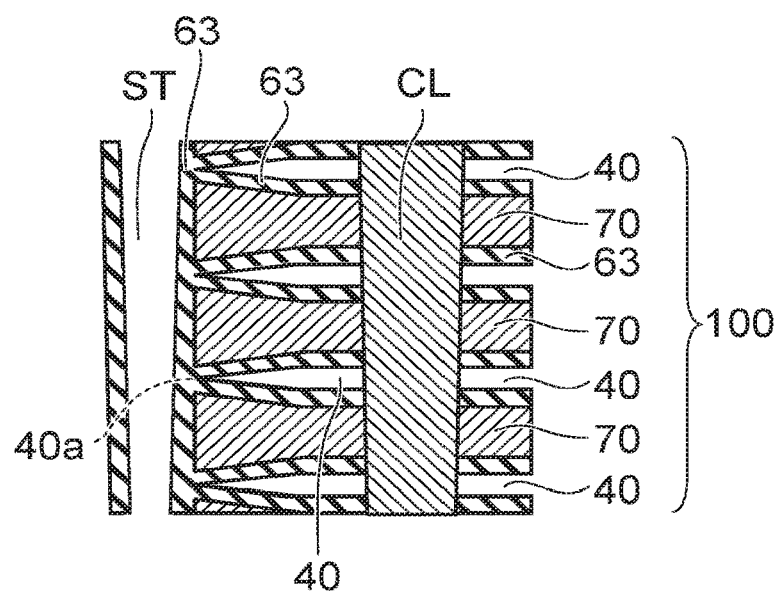

Next, as shown in FIG. 43B, the insulating film 63 is formed on the side surface of the slit ST. At this time, a source gas of the insulating film 63 enters the gap 40 in communication with the slit ST, so that the insulating film 63 may be deposited also in the gap 40. However, since the edge portion 40a of the gap 40 on the slit ST side is narrowed, the edge portion 40a of the gap 40 on the slit ST side is closed before the gap 40 is filled up with the insulating film 63. The process and the structure shown in FIG. 41A to FIG. 43B reliably maintain the gap 40 between the electrode films 70.

When the insulating film 63 is formed on the side surface of the slit ST, the insulating film 63 may also be formed thinly on an inner wall of the gap 40. That is, the insulating film 63 is formed on an upper surface and under a lower surface adjacent to the gap 40 in the electrode film 70. The upper surface and the lower surface of the electrode film 70 are not exposed in the gap 40, but covered and protected by the insulating film 63.

Figure 44:
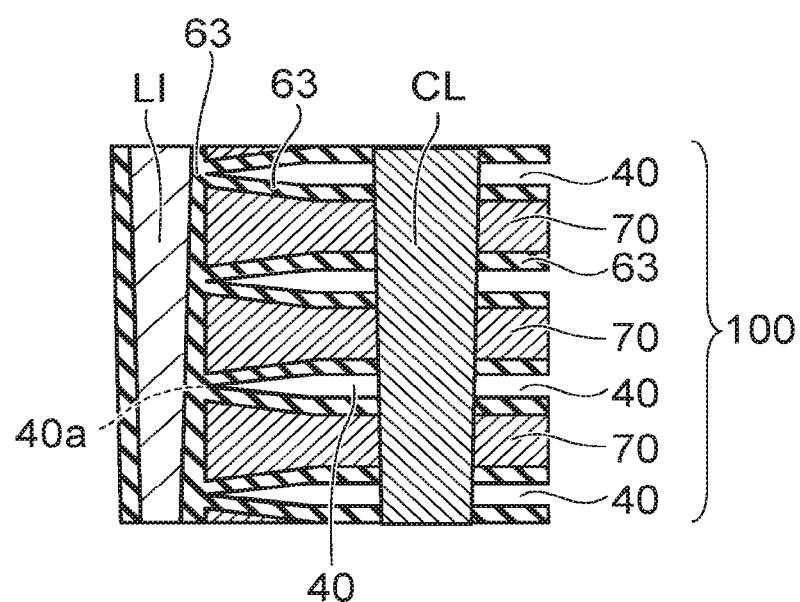

Thereafter, the conductive portion LI is buried in the slit ST as shown in FIG. 44.

Figure 45:
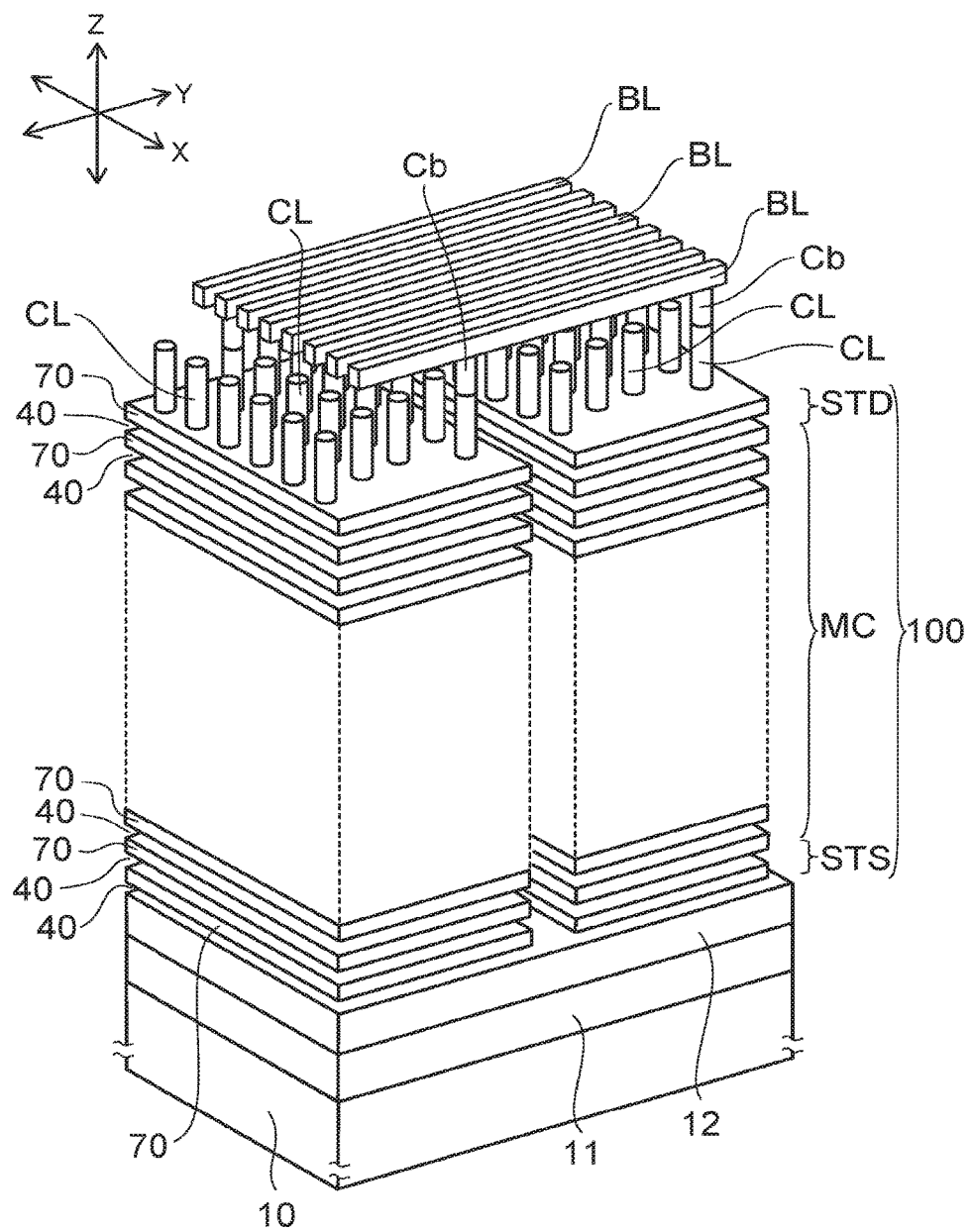
FIG. 45 is a schematic perspective view of another memory cell array of the embodiment.

As shown in FIG. 45, a layer 11 and a layer 12 may be formed between the substrate 10 and the stacked body 100. The layer 11 is formed between the substrate 10 and the layer 12. The layer 12 is formed between the layer 11 and the stacked body 100.

The layer 12 is a conductive layer or a semiconductor layer. Or the layer 12 includes a conductive layer and a semiconductor layer.

The layer 11 includes a control circuit including a transistor and an interconnection.

A lower end of the semiconductor film 20 is connected to the layer 12. The layer 12 is connected to the transistor of the control circuit via the interconnection.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
a substrate;
a stacked body provided on the substrate, the stacked body including a plurality of electrode films, a first insulating film, and a second insulating film, the electrode films stacked with air gaps interposed between the electrode films, the first insulating film provided between a lowermost electrode film of the electrode films and the substrate and being a metal oxide film, a silicon carbide film, or a silicon carbonitride film, the second insulating film provided on an uppermost electrode film of the electrode films and being a metal oxide film, a silicon carbide film, or a silicon carbonitride film;
a stacked film including a semiconductor film extending in a stacking direction of the stacked body in the stacked body, and a charge storage film provided between the semiconductor film and the electrode films, a lower end of the semiconductor film being in contact with the substrate;
a conductive portion extending in the stacking direction in the stacked body and including a lower end in contact with the substrate; and
a third insulating film provided between a side surface of the conductive portion and the stacked body,
a thickness in the stacking direction of an edge portion of one of the electrode films on the conductive portion side being thicker than a thickness of a portion of the one of the electrode films adjacent to the stacked film, and
the third insulating film closing edge portions on the conductive portion side in the air gaps.

2. The device according to claim 1, wherein
the stacked film includes a metal oxide film provided on an outermost side of the stacked film.

3. The device according to claim 1, wherein
the first insulating film is in contact with a surface of the substrate and the lowermost electrode film.

4. The device according to claim 1, wherein
an etching rate of the first insulating film and the second insulating film with phosphoric acid is 1/30 or less of an etching rate of a silicon nitride film with phosphoric acid, and
an etching rate of the first insulating film and the second insulating film with hydrofluoric acid is 1/30 or less of an etching rate of a silicon oxide film with hydrofluoric acid.

5. The device according to claim 1, further comprising a fourth insulating film provided on upper and lower surfaces of the electrode films and adjacent to the air gaps.

6. The device according to claim 1, wherein the second insulating film is directly in contact with the uppermost electrode film.

7. The device according to claim 1, wherein
the metal oxide films of the first insulating film and the second insulating film contain at least any of tantalum oxide, zirconium oxide, and hafnium oxide.

8. The device according to claim 1, wherein the semiconductor film extends in the stacking direction through the second insulating film.

9. The device according to claim 1, wherein the second insulating film is not provided between the electrode films.

10. A semiconductor device comprising:
a substrate;
a stacked body provided on the substrate, the stacked body including a plurality of electrode films, a back gate, and a first insulating film, the electrode films stacked with gaps interposed between the electrode films, the back gate provided between a lowermost electrode film of the electrode films and the substrate, the first insulating film provided on an uppermost electrode film of the electrode films and being a metal oxide film, a silicon carbide film, or a silicon carbonitride film;
a stacked film including a first semiconductor film extending in a stacking direction of the stacked body in the stacked body, and a charge storage film provided between the first semiconductor film and the electrode films;
a conductive portion extending in the stacking direction of the stacked body in the stacked body;

a second semiconductor film provided below the back gate and connected to the first semiconductor film and the conductive portion;

a gate insulating film provided between the back gate and the second semiconductor film; and a second insulating film provided between a side surface of the conductive portion and the stacked body, a thickness in the stacking direction of an edge portion of one of the electrode films on a side of the conductive portion being thicker than a thickness of a portion of the one of the electrode films adjacent to the stacked film, and the second insulating film closing edge portions on a side of the conductive portion in the gaps.

11. The device according to claim 10, wherein the metal oxide film contains at least any of tantalum oxide, zirconium oxide, and hafnium oxide.

12. The device according to claim 10, wherein the back gate contains silicon as a main component.

13. The device according to claim 10, wherein the stacked film includes a metal oxide film provided on an outermost side.

14. The device according to claim 10, further comprising a third insulating film provided on an upper and lower surfaces of the electrode films and adjacent to the gaps.

15. The device according to claim 10, wherein the first semiconductor film extends in the stacking direction through the first insulating film.

16. The device according to claim 10, wherein the first insulating film is not provided between the electrode films.

* * * * *